(12) United States Patent
Loopstra et al.

(10) Patent No.: US 7,671,968 B2
(45) Date of Patent: Mar. 2, 2010

(54) LITHOGRAPHIC APPARATUS HAVING MASKING PARTS AND DEVICE MANUFACTURING METHOD

(75) Inventors: Erik Roelof Loopstra, Heeze (NL);
Arno Jan Bleeker, Westerhoven (NL);
Heine Melle Mulder, Veldhoven (NL);
Oscar Franciscus Jozephus Noordman, Eindhoven (NL);
Timotheus Franciscus Sengers, s-Hertogenbosch (NL); Laurentius Catrinus Jorritsma, Helmond (NL); Mark Trentelman, Heeswijk-Dinther (NL); Gerrit Streutker, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 297 days.

(21) Appl. No.: 11/486,378

(22) Filed: Jul. 14, 2006

(65) Prior Publication Data
US 2007/0013885 A1    Jan. 18, 2007

Related U.S. Application Data

(63) Continuation-in-part of application No. 11/445,466, filed on Jun. 2, 2006, which is a continuation-in-part of application No. 11/335,715, filed on Jan. 20, 2006, which is a continuation-in-part of application No. 11/179,780, filed on Jul. 13, 2005, now Pat. No. 7,417,715.

(51) Int. Cl.
*G03B 27/72*    (2006.01)

(52) U.S. Cl. ........................................ 355/71

(58) Field of Classification Search ............... 355/71, 355/74, 75, 53, 67
See application file for complete search history.

(56) References Cited

U.S. PATENT DOCUMENTS

| | | | |
|---|---|---|---|
| 5,923,403 A | 7/1999 | Jain | 355/26 |
| 6,383,940 B1 | 5/2002 | Yoshimura | |
| 6,628,372 B2 | 9/2003 | McCullough et al. | 355/75 |
| 6,800,408 B2 | 10/2004 | McCullough et al. | |
| 2002/0160277 A1* | 10/2002 | Kyoh et al. | 430/5 |
| 2003/0142284 A1 | 7/2003 | Lin | 355/77 |
| 2003/0147060 A1 | 8/2003 | Tokuda et al. | 355/53 |
| 2004/0263846 A1 | 12/2004 | Kwan | |
| 2005/0012913 A1 | 1/2005 | Verweij et al. | |
| 2005/0140957 A1 | 6/2005 | Luijkx et al. | |

* cited by examiner

*Primary Examiner*—Peter B Kim
*Assistant Examiner*—Chia-how Michael Liu
(74) *Attorney, Agent, or Firm*—Pillsbury Winthrop Shaw Pittman LLP

(57) ABSTRACT

A lithographic apparatus includes a masking device that includes a first masking part configured to obscure a first part of a first patterning device before the pattern of the first patterning device is impinged by a radiation beam, a second masking part having an adjustable length, the second masking part configured to obscure a second part of the first patterning device after the pattern of the first patterning device is impinged by the radiation beam and to obscure a first part of a second patterning device before the pattern of the second patterning device is impinged by the radiation beam, and a third masking part configured to obscure a second part of the second patterning device after the pattern of the second patterning device is impinged by the radiation beam.

24 Claims, 24 Drawing Sheets

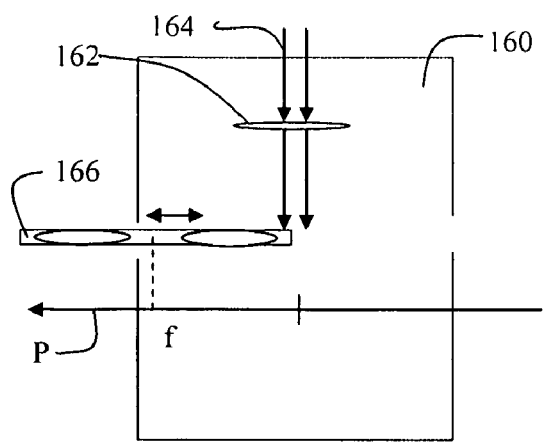 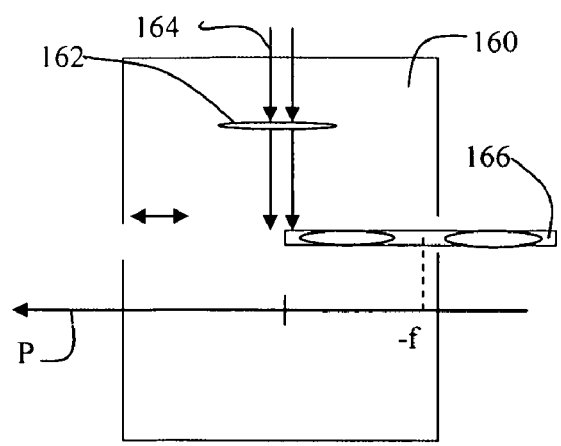
Fig. 24a  Fig. 24b
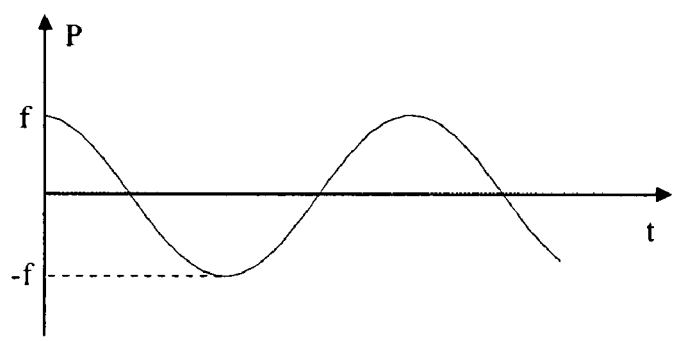
Fig. 24c

LITHOGRAPHIC APPARATUS HAVING MASKING PARTS AND DEVICE MANUFACTURING METHOD

CROSS REFERENCE TO RELATED APPLICATIONS

This application is a continuation-in-part of U.S. patent application Ser. No. 11/445,466 filed on Jun. 2, 2006, which is a continuation-in-part of U.S. patent application Ser. No. 11/335,715, filed Jan. 20, 2006, which is a continuation-in-part of U.S. patent application Ser. No. 11/179,780, filed Jul. 13, 2005, the entire contents of these applications are incorporated herein by reference.

FIELD

The present invention relates to a stage apparatus, a lithographic apparatus, a masking device and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to obtain the appropriate image on the substrate, it may be desirable to expose the target portion on the substrate twice or more. Such multiple exposures can be done using a different pattern for each exposure or using a different optical setting in the projection system or the illumination system of the lithographic apparatus or both. In case a different pattern is used for the different exposures, these different patterns can, e.g., be provided by different patterning devices. As an example, it may be desirable for a substrate to have both an exposure using a phase shift mask and an exposure with a trim mask. It may be desirable that both exposures have different exposure conditions. Conventionally, such a 'double exposure' is obtained by first exposing the entire substrate with a first patterning device (e.g., a phase shift mask), then exchanging the first patterning device with a second patterning device (e.g., a trim mask) and finally exposing the entire substrate with the second patterning device. This procedure is rather time consuming and generally result in an inferior performance with respect to throughput (i.e., number of substrates that is processed per unit of time). The drawback of changing the patterning devices can be mitigated by using multiple patterning devices on one stage, as described in U.S. Pat. No. 6,800,408. Despite the use of multiple patterning devices on one stage, the exposure method presented may still have a significant impact on the throughput of the apparatus.

SUMMARY

According to an embodiment of the invention, there is provided a stage apparatus for a lithographic apparatus provided with a projection system to project a pattern onto a substrate, wherein the stage apparatus is constructed and arranged to perform a scanning operation of a first and second patterning device with respect to the projection system, whereby during the scanning operation a pattern of the first patterning device and a pattern of the second patterning device are projected on the substrate wherein the stage apparatus is constructed and arranged to position the patterning devices during the scanning operation such that a distance between the patterns substantially equals a predetermined function of the reduction factor of the projection system and a non-zero number of exposure field pitches of a field pattern of the substrate, allowing an exposure of a first exposure field with the first patterning device and a second exposure field with the second patterning device, the second exposure field being spaced apart from the first exposure field by the non-zero number of exposure field pitches.

According to a further embodiment of the invention there is provided a lithographic apparatus including an illumination system configured to condition a radiation beam; a stage apparatus constructed and arranged to perform a scanning operation of a first and second patterning device each provided with a pattern, the patterning devices being capable of imparting the radiation beam with the patterns to form a patterned radiation beam; a substrate table constructed to hold a substrate; and a projection system configured to project the patterned radiation beam onto a target portion of the substrate, whereby during the scanning operation the pattern of the first patterning device and the pattern of the second patterning device are projected on the substrate and wherein the stage apparatus is constructed and arranged to position the patterning devices during the scanning operation such that a distance between the patterns substantially equals a predetermined function of the reduction factor of the projection system and a non-zero number of exposure field pitches of a field pattern of the substrate, allowing an exposure of a first exposure field with the first patterning device and a second exposure field with the second patterning device, the second exposure field being substantially spaced apart from the first exposure field by the non-zero number of exposure field pitches.

According to another embodiment of the invention, there is provided a masking device for use in a lithographic apparatus according to the present invention, the masking device including: a first masking part to, in use, obscure a first part of the first patterning device before the pattern of the first patterning device is impinged by the radiation beam, a second masking part to, in use, obscure a second part of the first patterning device after the pattern of the first patterning device is impinged by the radiation beam and for obscuring a first part of the second patterning device before the pattern of the second patterning device is impinged by the radiation beam and a third masking part for, in use, obscuring a second part of the second patterning device after the pattern of the second patterning device is impinged by the radiation beam.

According to an other embodiment of the present invention, there is provided a method of exposing a substrate using a lithographic apparatus provided with a projection system, the method including: arranging two patterning devices each including a pattern on a stage apparatus such that the patterns of both devices are arranged adjacent to each other in a scanning direction with a distance between the patterns substantially equal to a predetermined function of a reduction factor of the projection system and a non-zero number of exposure field pitches of a field pattern of the substrate; providing the substrate on a substrate stage; accelerating both the patterning devices and the substrate to a predetermined speed relative to the projection system; projecting a pattern of the first patterning device onto a first field of the substrate while substantially maintaining the speed; displacing both the patterning devices and the substrate stage substantially at the predetermined speed thereby skipping the non-zero number of exposure field pitches on the substrate arranged adjacent to the first field in the scanning direction; projecting a pattern of the second patterning device onto a further field of the substrate arranged adjacent to the non-zero number of exposure field pitches on the substrate in the scanning direction.

According to another embodiment of the invention there is provided an illuminator for a lithographic apparatus, the illuminator including first and second illuminator channels, each illuminator channel having elements which are adjustable in order to provide a radiation beam with desired properties, and a first switching device arranged to switch the radiation beam between the first and second illuminator channels, the illuminator further including an additional part and a second switching device the second switching device being arranged to receive the radiation beam from the first and second illuminator channels and direct the radiation beam through the additional illuminator part, the additional illuminator part having elements which apply additional desired properties to the radiation beam.

According to another embodiment of the present invention there is provided a method of applying desired properties to a radiation beam, the method including adjusting elements of a first illuminator channel to apply desired properties to a radiation beam, adjusting elements of a second illuminator channel to apply different desired properties to the radiation beam, adjusting elements of an additional part of the illuminator to apply additional desired properties to the radiation beam, then using a first switching device to alternately direct the radiation beam through the first and second illuminator channel and using a second switching device to direct the radiation beam through the additional part of the illuminator.

In an embodiment of the invention, there is provided an illuminator for a lithographic apparatus, the illuminator including a first and a second illuminator channels, each illuminator channel including elements which are adjustable to provide a radiation beam with a desired properties; a switching mechanism arranged to switch the radiation beam between the first and second illuminator channels; an additional illuminator part, the switching mechanism arranged to receive the radiation beam from the first and second illuminator channels and direct the radiation beam through the additional illuminator part, the additional illuminator part including elements which apply additional desired properties to the radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 13b schematically depicts a cross-sectional ZY-view (A-A') on the arrangement of FIG. 13a.

FIGS. 24a and 24b schematically depict two positions of the holder of FIG. 23.

FIG. 24c schematically depicts the position of the holder as a function of time.

DETAILED DESCRIPTION

Figure 1A:
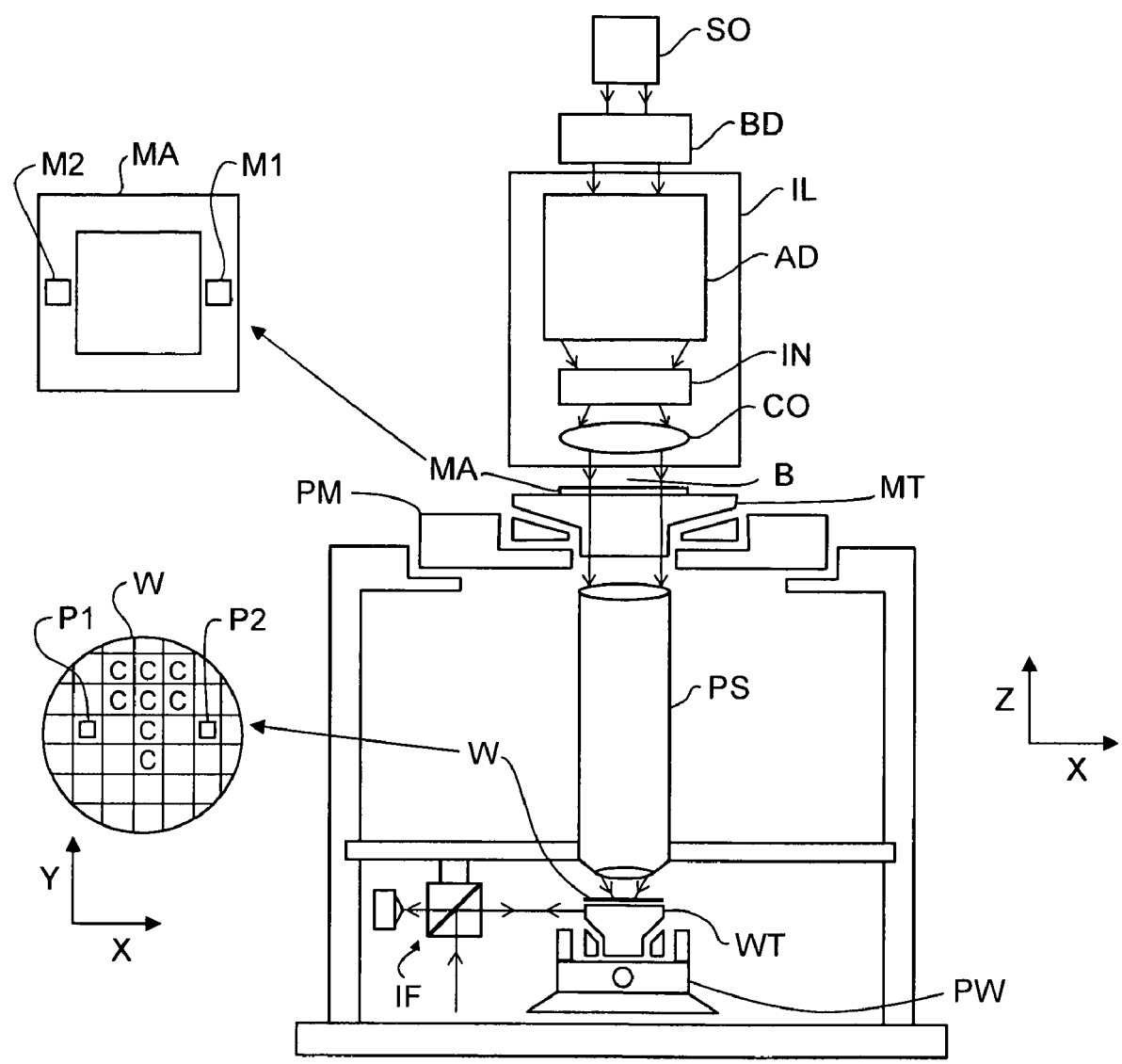
FIG. 1A depicts a lithographic apparatus according to an embodiment of the invention.

FIG. 1a schematically depicts a lithographic apparatus according to one embodiment of the invention. The apparatus includes:

an illumination system (this may be equivalently referred to as an illuminator) IL configured to condition a radiation beam B (e.g., UV radiation or EUV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern to the radiation beam may not exactly correspond to the desired pattern in the target portion of the substrate, for example if the pattern includes phase-shifting features or so called assist features. Generally, the pattern to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1A, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. A possible arrangement of the positioner PW and the substrate table WT are described in FIG. 1B. Similarly, the first positioner PM and another position sensor (which is not explicitly depicted in FIG. 1A) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. Alternatively, the object table MT or WT can be directly driven by a drive arrangement including actuators and/or linear motors rather than applying a cascaded arrangement as described in FIG. 1B.

In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Figure 1B:
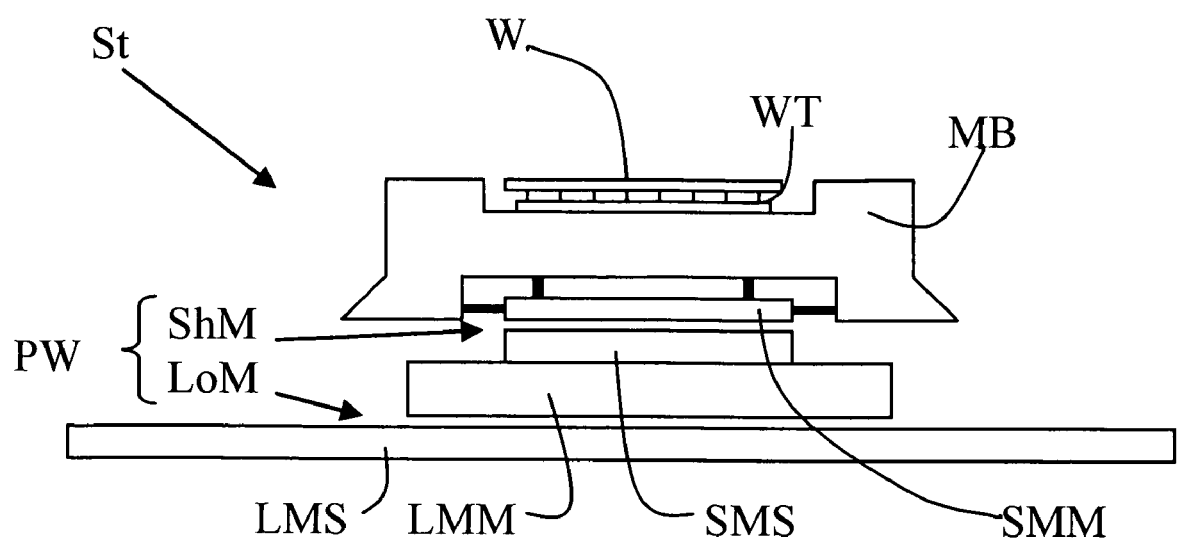
FIG. 1B shows a stage of the lithographic apparatus according to FIG. 1A.

FIG. 1B shows a substrate stage St (also called substrate chuck) as can be applied in a lithographic apparatus according to FIG. 1A. The stage St includes the non-stationary parts of the second positioner PW, a mirror block MB, and the substrate table WT mounted to the mirror block MB. In this example, the mirror block MB is provided with interferometer-mirrors which are arranged for cooperation with interferometers for measuring the position of the mirror block MB.

The second positioner PW is arranged for positioning the mirror block MB and the substrate table WT. The second positioner PW includes the short stroke module (which is provided with a short stroke motor ShM) and the long stroke module (which is provided with a long stroke motor LoM).

The long stroke motor LoM includes a stationary part LMS that can be mounted to a stationary frame or a balance mass (not shown) and a non-stationary part LMM that is displaceable relative to the stationary part. The short stroke motor ShM includes a first non-stationary part SMS (that may be mounted to the non-stationary part LMM of the long stroke module) and a second non-stationary part SMM (that may be mounted to the mirror block MB).

It should be noted that the mask table MT and the first positioner PM (see FIG. 1A) may have a similar structure as depicted in FIG. 1B.

A so-called dual stage machine may be equipped with two or more stages as described. Each stage can be provided with an object table (such as the substrate table WT). In such an arrangement, a preparatory step such as the measurement of a height map of the substrate disposed on one of the object tables can be performed in parallel with the exposure of the substrate disposed on another object table. In order to expose a substrate that previously has been measured, the stages may change position from the measurement location to the exposure location (and vice versa). As an alternative, the object tables can be moved from one stage to another.

The apparatus as depicted in FIG. 1A could be used in at least one of the following modes:

1. In step mode, the mask table MT and the substrate table WT are kept essentially stationary, while an entire pattern to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 2a-2f schematically depicts an exposure sequence according to an embodiment of the present invention that can be applied in a lithographic apparatus.

Figures 2A, 2B:
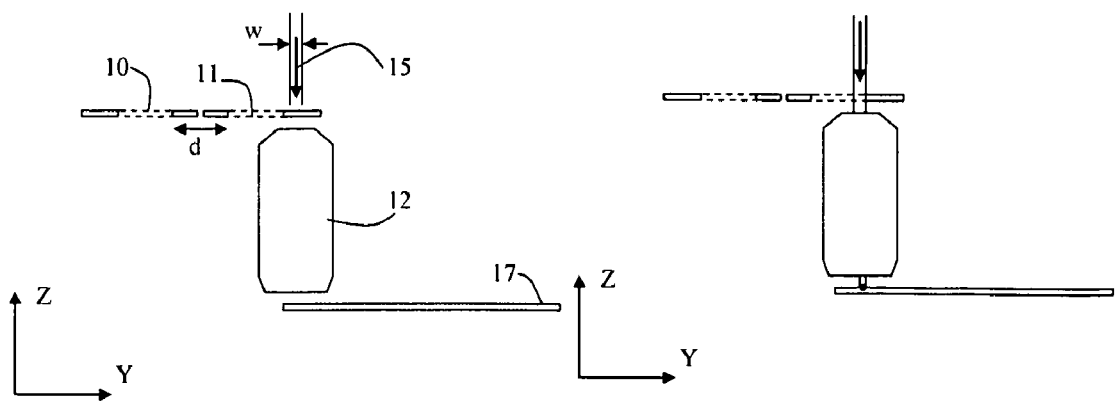
FIGS. 2a-2f schematically depict an exposure sequence according to the present invention.
Figures 2C, 2D:
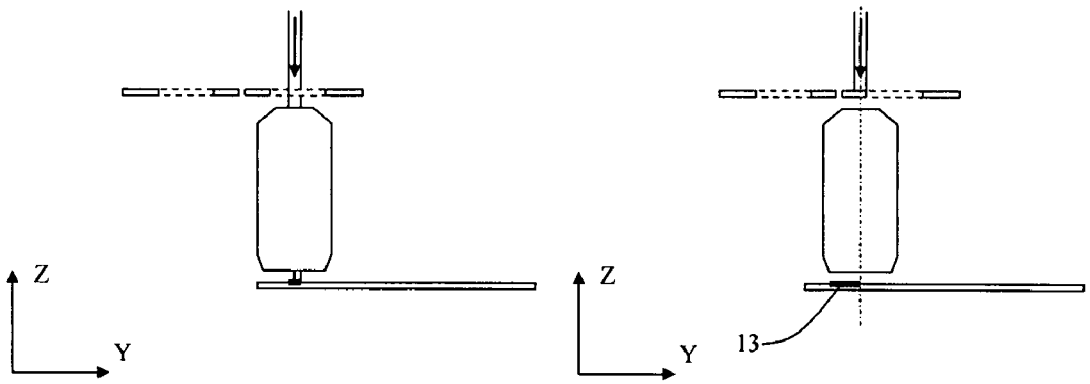

FIG. 2a schematically depicts two patterning devices including a pattern 10, 11 disposed adjacent to each other in the scanning direction (Y-direction). The patterning devices can be arranged adjacent to a projection system 12 of a lithographic apparatus. Both patterns are spaced apart in the Y-direction over a distance d. The distance d may equal a predetermined function of the reduction factor of the projection system 12 of the lithographic apparatus and a non-zero number of exposure field pitches of a field pattern of the wafer (or substrate). The exposure field pitch can be defined as length in the scanning direction of a field to be exposed on the substrate. As an example, the distance d can be substantially equal to the reduction factor of the projection system of the lithographic apparatus multiplied with the exposure field pitch of the field pattern on the wafer. In case both patterns 10, 11 substantially have the same length in the Y-direction, the distance d may correspond to the length of the patterns in the Y-direction. Other parameters such as the gap between two adjacent fields on the substrate may also be applied in the predetermined function that defines the distance d (see e.g., eq. (1)). In the arrangement as shown in FIGS. 2a-2f, both patterns 10, 11 substantially have the same length in the Y-direction and the distance d substantially corresponds to this length.

FIG. 2a further shows a projection beam 15, a projection system 12 and a substrate 17 whereon the patterns are to be projected (in general, the substrate is mounted on a substrate stage, not shown in this figure). Each patterning device can be mounted on a separate object table or both patterning devices can be mounted on a common object table. The object table or tables can be mounted on a stage apparatus including a positioning device for positioning the object table or object tables. In order to perform this positioning, the positioning device may include a plurality of linear motors and/or actuators for positioning the object table or object tables. For clarity reasons, FIGS. 2a-2f do not show the object tables or the positioning device.

It should be noted that an arrangement as described (i.e., an arrangement including two patterning devices) enables the use of patterning devices having standardized dimensions. The use of an enlarged single patterning device including two patterns adjacent to each other (as, e.g., disclosed in U.S. Pat. No. 6,383,940 wherein two patterns are provided on one patterning device having a comparatively small gap between the patterns) may pose problems in that not all lithographic apparatuses are arranged to handle patterning devices that are larger that the industry standard. Furthermore, in case different illumination settings are desired for the exposure of the different patterns, providing a comparatively small gap between the two adjacent patterns may provide insufficient time to change the illumination settings in between the two exposures. Increasing this gap would however increase the problem to handle the enlarged patterning device. Increasing the time to change the illumination settings by decreasing the scanning velocity may reduce the number of substrates that can be processed per unit of time.

Figures 2E, 2F:
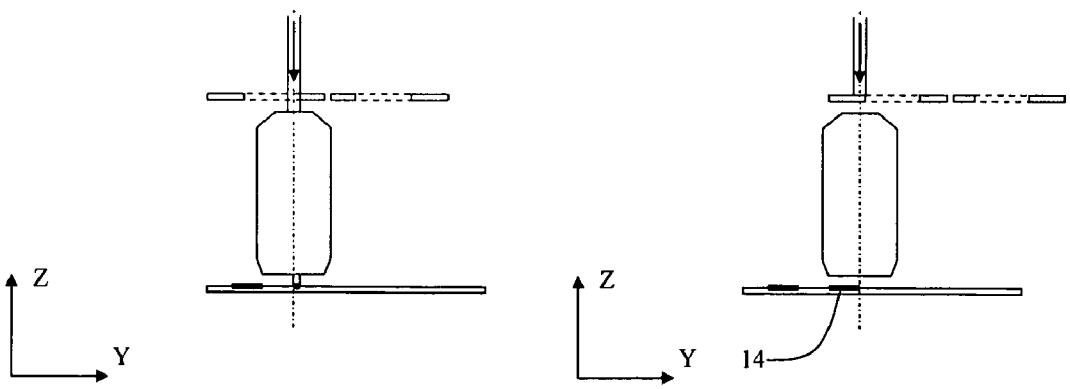

Prior to the exposure of the first pattern 11, both the positioning device provided with the patterning devices and the substrate table can be accelerated to a predetermined speed. Once they are synchronized, the projection of the first pattern 11 on the substrate can start (FIGS. 2b & 2c) resulting in the exposure of the first field 13 (FIG. 2d) by the radiation beam 15. The radiation beam 15 has a width w in the Y-direction, also referred to as the slit-width w. When the first field has been exposed, both the positioning device and the substrate table can substantially maintain their speed. When proceeding at that speed, the substrate table can be displaced over a distance substantially equal to the length of a field in the Y-direction (i.e., one exposure field is 'skipped') between the exposure of the first pattern and the exposure of the second pattern. Proceeding with substantially the same speed, the second pattern can subsequently be projected onto a second field 14 (FIGS. 2e & 2f). As a result of this process, two fields are exposed on the substrate, both fields being spaced apart over a distance substantially equal to the length of the field in the Y-direction, i.e., in the arrangement as shown, one field is left unexposed between fields 13 and 14.

Figure 3:
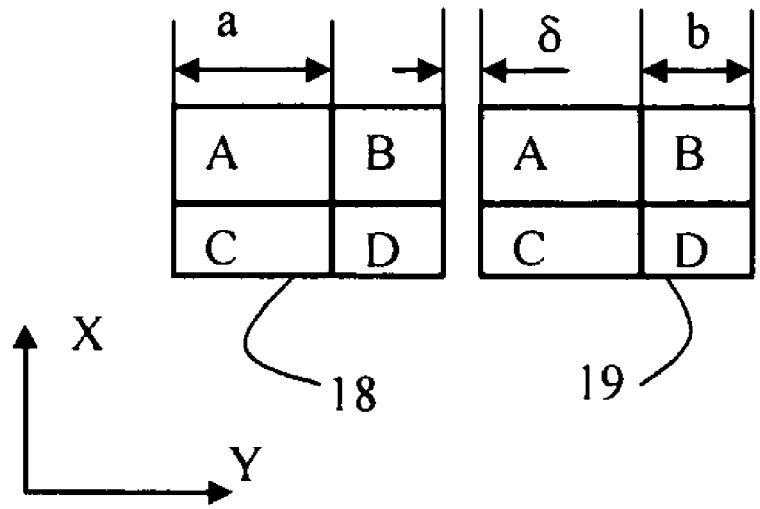
FIG. 3 schematically depicts two dies composed of a plurality of fields.

The size of the exposed fields on the substrate may correspond to the size of the die that is manufactured. Alternatively, the exposed field may only be a part of the die; as such, the die may include of a number of adjacent fields that may require exposure by different patterns. Once the different fields of such a die are exposed, so-called stitching techniques can be applied to connect the different fields. Connecting the different fields that form a die may e.g. be obtained by a subsequent exposure of these fields. As an example, FIG. 3 schematically depicts two dies 18 arranged adjacent to each other. Each die includes four different fields (indicated as A, B, C and D) require a different exposure.

In practice, a small gap 5 may remain between adjacent dies on a semiconductor substrate (or wafer) in order to easily separate the individual dies (FIG. 3). Therefore, in case the exposure field size corresponds to the die size, the distance d between the first and second pattern provided on the positioning device may be set according to the following equation:

$$d = (Fs + 2 \cdot \delta) \cdot Rf \quad (1)$$

wherein:
Fs=the exposure field size (or die size) on the substrate
δ=the gap between adjacent dies on the substrate
Rf=the reduction factor of the projection system (usually 4 or 5)

Figure 4A:
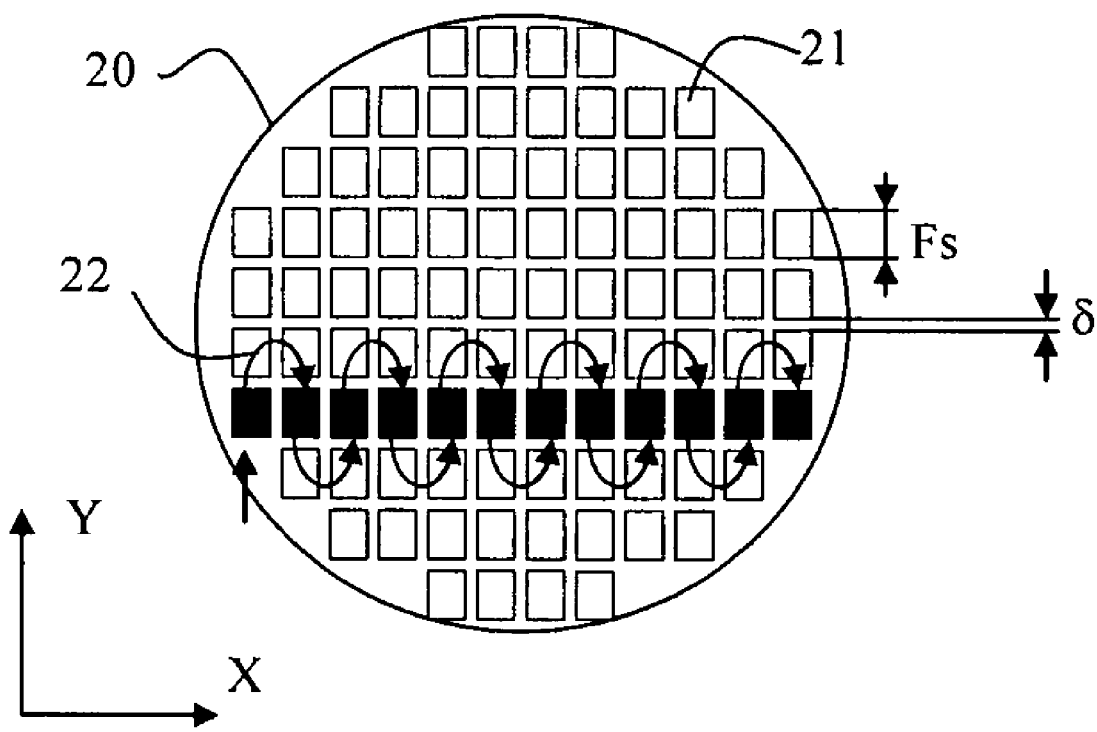
FIG. 4a schematically depicts a possible conventional exposure sequence.
Figure 4B:
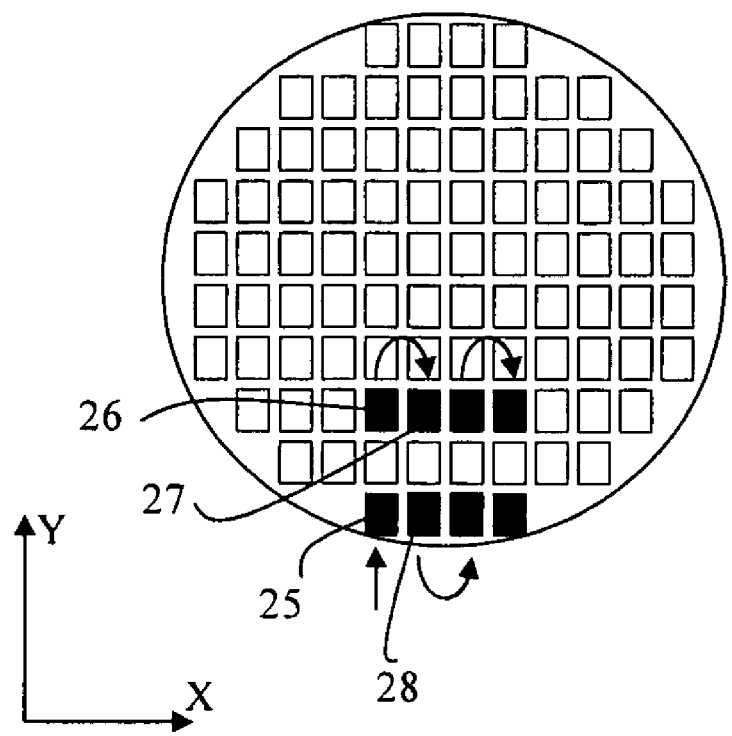
FIG. 4b schematically depicts a possible exposure sequence according to an embodiment of the present invention.

(Fs+2δ) corresponds to the gap between a first exposure field in a row of fields arranged in the scanning direction and a third exposure field in this row (see e.g., the distance between dies 25 and 26 in FIG. 4b). When the distance d between the first and second pattern is set according to equation (1), both the patterning devices and the substrate can substantially maintain their speed in between the exposure of the first and second pattern. In general, δ will be small compared to Fs, therefore, d can approximately be set to Fs·Rf.

In case the exposure field size does not correspond to the die size, the gap between adjacent exposure fields can be much smaller than δ, or may be non-existent (as schematically indicated by the adjacent fields A and B in FIG. 3).

Depending on the actual arrangement of the fields that are exposed, a person skilled in the art can calculate the desired distance between the two patterns on the patterning devices such that both the patterning devices and the substrate can substantially maintain their speed in between the exposure of the first and second pattern. As an example (referring to FIG. 3), in order to expose the fields A and B of dies 18 and 19 of FIG. 3, the patterning devices for exposing these fields can be arranged such that the distance between the patterns in the Y-direction equals (a+b+δ)·Rf, wherein a and b correspond to the length of fields A and B in the Y-direction (see FIG. 3).

The required time Te to expose a field in a step and scan process can be approximated by the following formula:

$$T_e = \frac{Y}{v} + \frac{2 \cdot v}{a} \quad (2a)$$

wherein:
Y=distance to be traveled at constant speed (equal to field-size Fs+slit-width w)
v=velocity during scanning
a=maximum acceleration of the positioning device holding the substrate For a given value of Y and a, the velocity can be optimized to minimize the exposure time $T_e$. The optimized velocity $V_{opt}$ is found to be $$V_{opt} = \sqrt{\frac{Y \cdot a}{2}} \quad (2b)$$

In a conventional lithographic apparatus, a double exposure of a field may require approximately twice this time.

In case the apparatus is arranged to expose fields on a substrate as indicated in FIGS. 2a-2f, the time for exposing two fields $T_{e2}$ can be approximated by:

$$T_{e2} = \frac{Y'}{v} + \frac{2 \cdot a}{v} \tag{3a}$$

wherein Y' corresponds to the distance that can be traveled at substantially constant speed during the exposure of the two fields and in between the two exposures. In case Y' is approximated by three times Y (the field-size Fs+the slit-width w), the optimal velocity of equation (3a) $V_{opt2}$ can be found to be sqrt(3) times higher than the optimal velocity of eq. (2a):

$$V_{opt2} = \sqrt{\frac{Y' \cdot a}{2}} \approx \sqrt{\frac{3 \cdot Y \cdot a}{2}} \approx \sqrt{3} \cdot V_{opt} \tag{3b}$$

It should be noted that during $T_{e2}$, two fields can be exposed. By applying the optimal velocity according to equations 2b or 3b in respective equations 2a and 3a, one can deduce that the time required per exposure is significantly smaller when the sequence described in FIGS. 2a-2f is applied instead of a conventional scanning sequence. In addition to the reduced exposure time (per field), it should be noted that the number of moves that are desired in the non-scanning direction (X-direction) are also reduced (see e.g., FIGS. 3a and 3b) As a result, the time to process a substrate can be reduced by approximately 30%.

Based on the above, it should be noted that embodiments of the present invention may also result in an improved throughput (the number of substrates processed per unit of time) in a single exposure situation (i.e., a situation wherein each field on the substrate only requires exposure by one pattern) by applying two substantially identical patterns on the stage apparatus.

The following figures schematically illustrate an exposure sequence of a number of fields on a substrate comparing a conventional approach with an approach according to an embodiment of the present invention. In the examples shown in FIGS. 4a-4d, 5a and 5b, the exposure field size is assumed to correspond to the die size. FIG. 4a schematically depicts a possible exposure sequence of a number of fields 21 on a substrate 20, the arrows indicating the order in which the fields are exposed. Also indicated in FIG. 4a are the exposure field size Fs and the gap δ between adjacent fields as used in equation (1). In between the exposure of two consecutive fields, the object tables provided with the patterning devices and the substrate 'turn around,' i.e., they are repositioned to expose the next field by a scanning movement in the opposite direction, and in addition to that, the object table provided with the substrate is also repositioned in the non-scanning direction (X-direction). The combined movement in the scanning direction (Y-direction) and the non-scanning direction (X-direction) is indicated by the curved arrows 22.

FIG. 4b schematically depicts a possible exposure sequence for a number of fields on a substrate 20 using a lithographic apparatus according to an embodiment of the present invention, including a stage apparatus provided with two patterning devices including substantially identical patterns, the patterns being displaced over a distance equal to the length of the pattern in the scanning direction (or, e.g., the length according to eq. (1)).

Figure 4C:
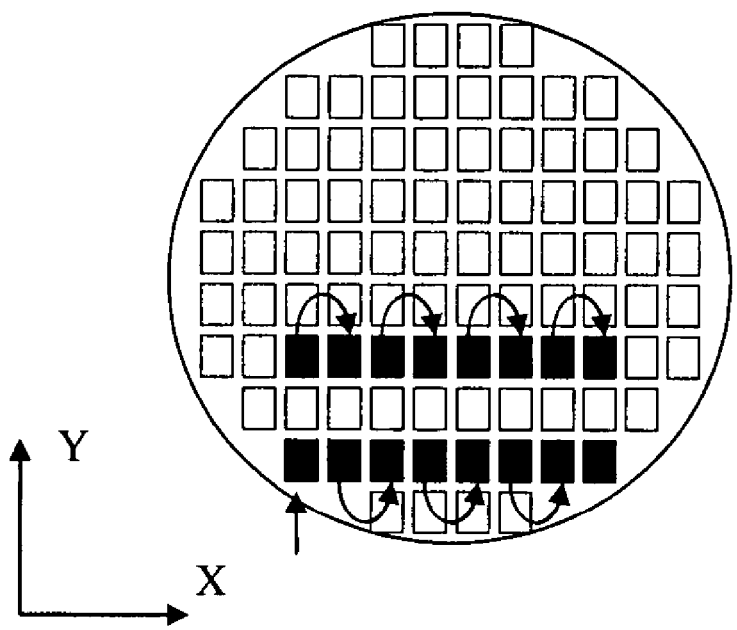
FIG. 4c schematically depicts a possible further exposure sequence according to an embodiment of the present invention.
Figure 4D:
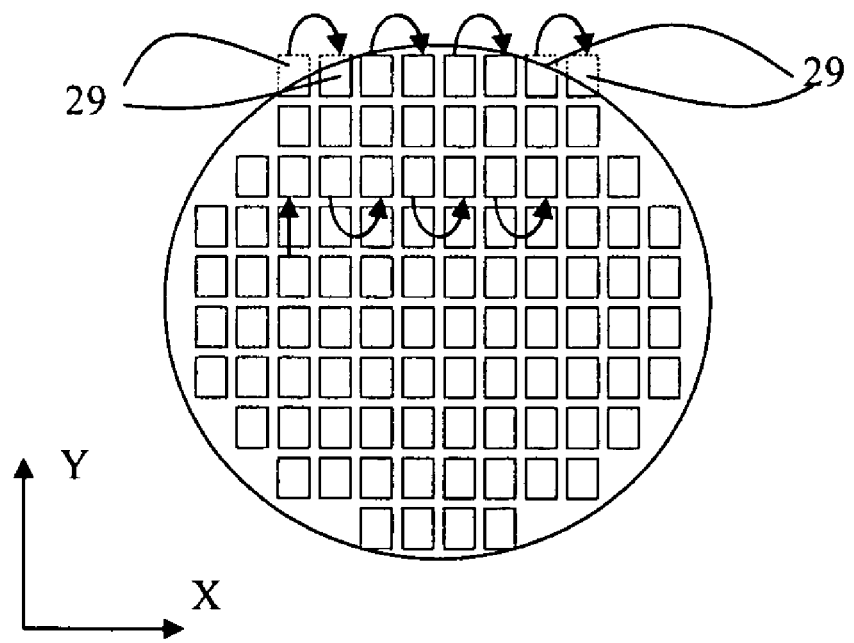
FIG. 4d schematically shows a number of edge fields and an exposure sequence according to an embodiment of the present invention.
Figure 5A:
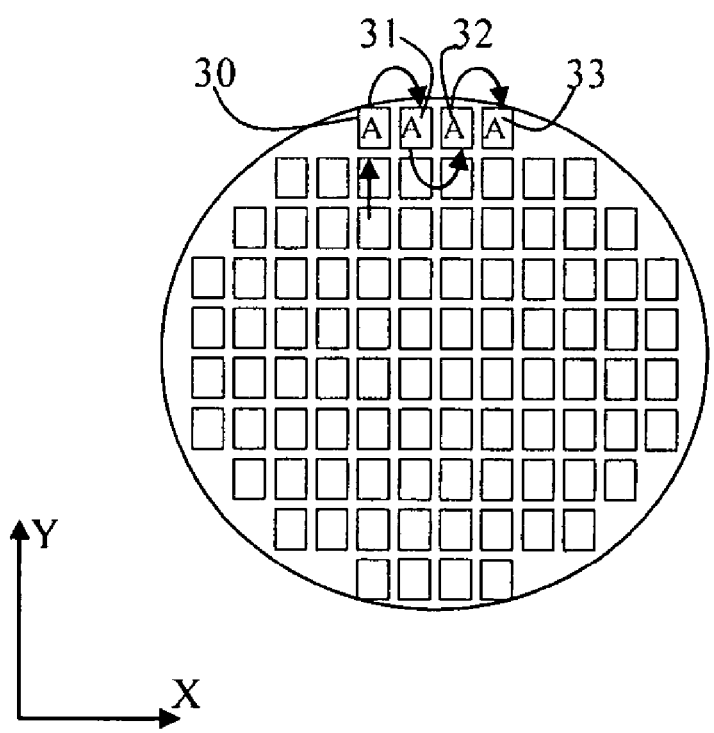
FIG. 5a schematically depicts a possible conventional exposure sequence using a pattern A.
Figure 5B:
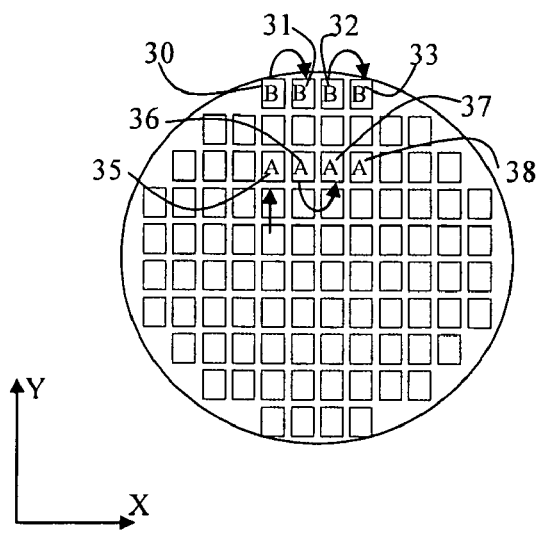
FIG. 5b schematically depicts a possible exposure sequence according to an embodiment of the present invention using a pattern A and a pattern B.

FIG. 4b schematically depicts the order in which the different fields may be exposed using the stage apparatus as described. The exposure process starts with field 25, followed by field 26. Between the exposure of field 25 and the exposure of field 26, both stage apparatus and substrate stage (i.e., the stage provided with the substrate) may remain at substantially the same (scanning) speed. After the exposure of field 26, both stage apparatus and substrate stage decelerate and accelerate in the opposite direction (-Y) in order to expose field 27 and 28. Once the indicated fields are exposed, the fields that are indicated in FIG. 4c may be exposed, using a similar approach. It will be appreciated by a person skilled in the art that a substantial part of the substrate may be exposed using the described process resulting in an important reduction of the time to process a substrate. As a consequence, the number of substrates processed per unit of time (i.e., the throughput of the apparatus) can be improved. It should further be noted that embodiments of the present invention may also be applied for the exposure of so-called edge fields or edge dies. Edge fields are exposure fields that are partly located outside the substrate area (FIG. 4d). FIG. 4d schematically shows a number of edge fields 29 and an exposure sequence (indicated by the arrows) according to an embodiment of the present invention. The exposure of the edge dies can be done in order to facilitate the further processing of the substrate.

The apparatus according to an embodiment of the present invention may also be applied in case a double exposure is desired for each field on the substrate. Assuming the stage apparatus is provided with two patterning devices including a pattern A (e.g., a phase shift mask) and a pattern B (e.g., a trim mask or a binary mask) to be applied on the substrate. It is assumed that the patterns are arranged such that the stage apparatus can maintain a substantially constant speed during the exposure of the substrate with the patterns and in between the exposures.

In a first act of the double exposure process, fields 30, 31, 32 and 33 (see FIG. 5a) may be exposed in a conventional manner using pattern A (the trajectory followed by the substrate stage is indicated by the arrows). In a second act (FIG. 5b), fields 35, 36, 37 and 38 may be exposed using pattern A and fields 30, 31, 32 and 33 are exposed with pattern B according to the process described in FIGS. 2a-2f. As a result of acts one and two, fields 30, 31, 32 and 33 have been exposed to both the pattern A and the pattern B.

Figure 6A:
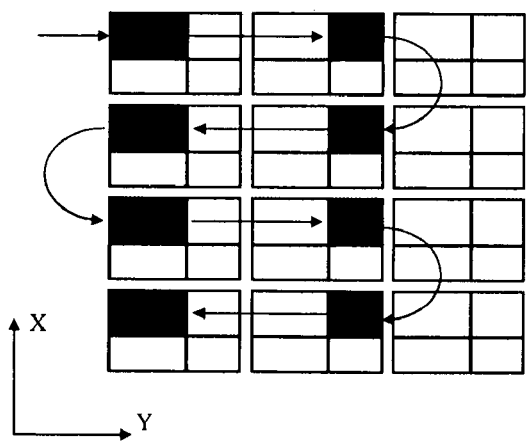
FIGS. 6a and 6b schematically depict a possible exposure sequence to expose parts of a die with different patterns.
Figure 6B:
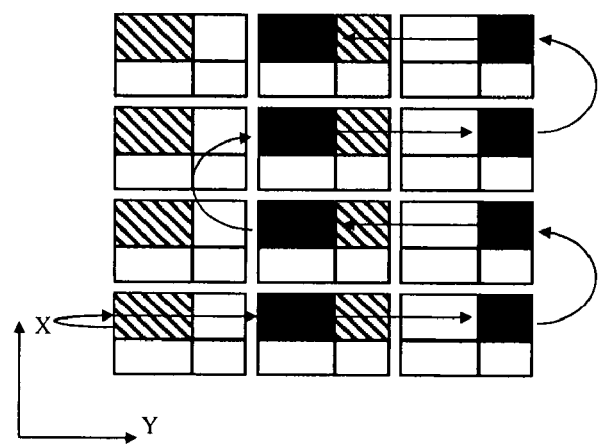

It will be clear to a person skilled in the art that a similar procedure may be applied in case the dies on the substrate are composed of different adjacent fields (see e.g., FIG. 3). FIGS. 6a and 6b schematically depict the exposure sequence in case the dies on the wafer are composed of four fields as indicated in FIG. 3 and the patterning devices are arranged to expose fields A and B. FIG. 6a schematically shows a first sequence of exposures of fields A and B. The exposure order is indicated by the arrows. FIG. 6b schematically depicts a subsequent exposure sequence. The fields exposed in the first sequence are indicated with a striped pattern.

Figure 7:
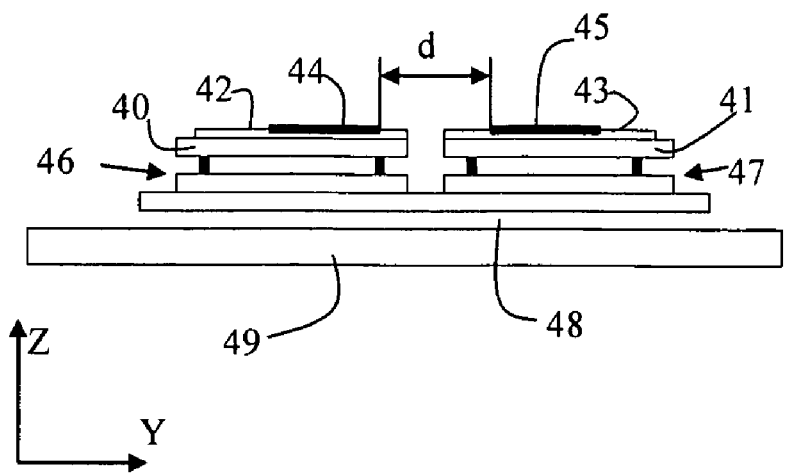
FIG. 7 schematically depicts a stage apparatus according to an embodiment of the present invention.

FIG. 7 schematically discloses a stage apparatus according to an embodiment of the present invention. The apparatus includes an arrangement including two object tables 40, 41. On each object table, a patterning device 42, 43 may be arranged, each patterning device including a pattern 44, 45. The apparatus further includes two actuator arrangements 46 and 47 for displacing and positioning the object tables over comparatively small distances. In order to enable these displacements, the actuator arrangement may, as an example, include of piezo-actuators or electromagnetic actuators. In a preferred embodiment, the actuator arrangement enables positioning of the object table in six degrees of freedom. In the apparatus as shown in FIG. 7, both actuator arrangements 46 and 47 may be mounted on a common first part 48 of a linear motor assembly for displacing the object tables over comparatively large distances in the Y-direction (the scanning direction). The linear motor assembly further includes a second part 49 constructed and arranged to co-operate with the first part for generating the required thrust in the Y-direction. In general, one part of the linear motor may include an array of alternating polarized permanent magnets, arranged in the Y-direction while the other part includes an array of coils arranged adjacent to each other in the Y-direction.

In the described arrangement, the actuator assemblies are constructed to enable a positioning of both patterns such that the distance d between both patterns may be made substantially equal to a predetermined function of the reduction factor of the projection system and a non-zero number of exposure field pitches of a field pattern of the substrate. As an example, d may be made equal to the length of a pattern in the Y-direction or equal to a value determined using eq. (1). In order to accommodate patterns of different sizes (e.g., varying from 30 mm to 100 mm), the desired displacement of the object tables relative to the first part 48 (by the actuator assemblies) may be in the order of about 40-50 mm.

Figure 8:
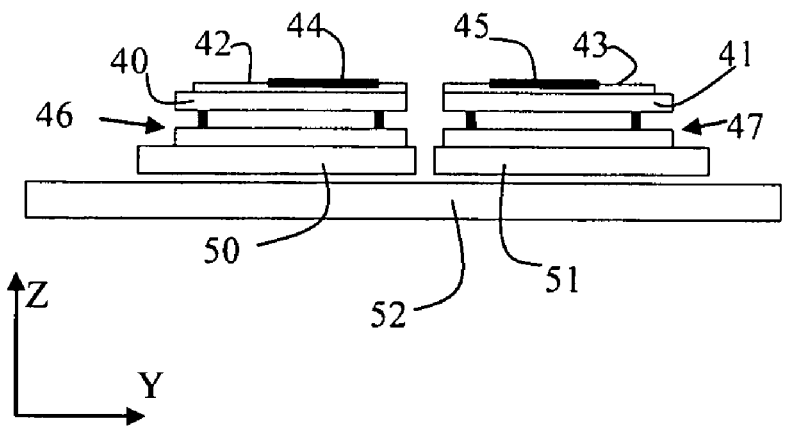
FIG. 8 schematically depicts an alternative stage apparatus according to an embodiment of the present invention.

Alternatively, rather than mounting both actuator assemblies on a common part of a linear motor assembly, each actuator assembly may be arranged on a separate linear motor part. This is illustrated in FIG. 8. FIG. 8 schematically describes a stage arrangement including two object tables 40, 41 provided with a patterning device 42, 43, each object table being mounted on an actuator assembly 46, 47. Each actuator assembly is mounted on a first linear motor part 50, 51 constructed and arranged to co-operate with a common second part 52. In this arrangement, the distance between both patterns 44 and 45 provided on the patterning devices may be adjusted using the linear motors.

A benefit of this arrangement is that the desired displacements of the actuator assembly may be substantially reduced compared to the arrangement of FIG. 7. As an example, it may be sufficient to provide an actuator assembly suited for displacements <1 mm in the required degrees of freedom. As a consequence, the actuator assembly may be made substantially smaller and lighter. Rather than having common second part for the linear motors, each linear motor may be provided with its own second part co-operating with the first part 50, 51.

As a second alternative, both patterning devices may be arranged on a common object table constructed to hold both patterning devices in such a configuration that the distance d between both patterns is substantially equal to a predetermined function of the reduction factor of the projection system and a non-zero number of exposure field pitches of a field pattern of the substrate. As an example, d may be equal to the length of a pattern in the Y-direction or equal to a value determined using equation (1). Such an arrangement is schematically depicted in FIG. 9a.

Figure 9A:
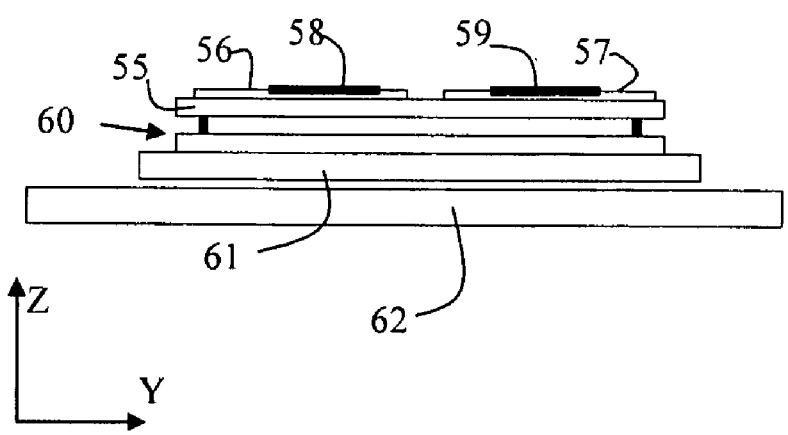
FIG. 9a schematically depicts a second alternative stage apparatus according to an embodiment of the present invention.
Figure 9B:
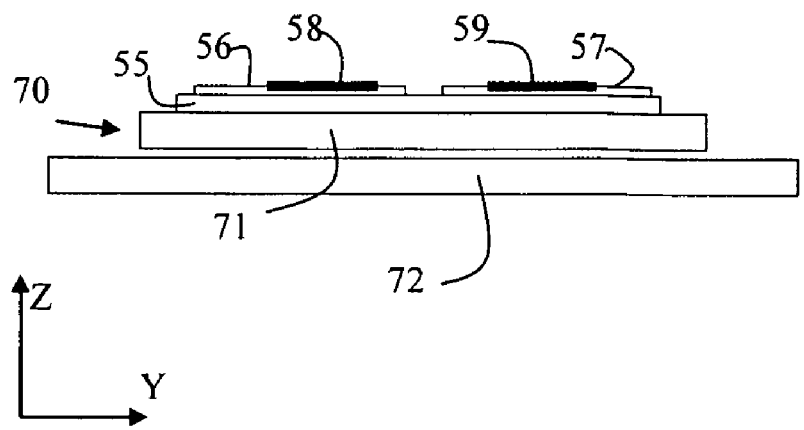
FIG. 9b schematically depicts a third alternative stage apparatus according to an embodiment of the present invention.

FIG. 9a schematically depicts an object table 55 provided with two patterning devices 56, 57, each provided with a pattern 58, 59. The object table 55 is mounted to an actuator assembly 60 for displacing the object table over comparatively small distances. The actuator assembly is mounted to a first part 61 of a linear motor that is constructed and arranged to co-operate with a second part 62 for displacing the object table over comparatively large distances in the Y-direction. As a third alternative, the object table (or object tables) may be directly driven by a drive arrangement including actuators and/or linear motors rather than applying a cascaded arrangement as described in FIG. 7, 8 or 9a. FIG. 9b schematically depicts such an arrangement. The arrangement includes an object table 55 provided with two patterning devices 56, 57, each provided with a pattern 58, 59 and a drive arrangement 70 including a first part 71 and a second part 72. The drive arrangement may, as an example, include a linear motor and a plurality of actuators for positioning the object table 55. The first part 71 may, as an example, include a plurality of coils interacting with a plurality of permanent magnets arranged on the second part 72 in order to displace and position the object table 55. It will be appreciated that the stage apparatus may also includes a first drive arrangement similar to the drive arrangement 70 for displacing and positioning a first object table provided with a first patterning device and a second drive arrangement similar to the drive arrangement 70 for displacing and positioning a second object table provided with a second patterning device.

The object table of FIG. 9a or 9b or the object tables of FIGS. 7 and 8 may be provided with a holding device for holding the patterning devices. Such a holding device may include vacuum pads or clamps, electrostatic clamps or mechanical clamps for holding the patterning devices and maintaining the position of the patterning devices relative to the object table or object tables substantially constant during the exposure process.

In order to determine the position of the patterning devices relative to, e.g., a reference frame or a projection system, a measurement system such as an interferometer system or an encoder system may be applied. In general, an encoder system may include a reading head and a grating. The grating may be one dimensional or two dimensional. As an example, the object table or object tables depicted in FIGS. 7 to 9b may be provided with one or more encoder reading heads constructed and arranged to co-operate with one or more gratings arranged adjacent to the object tables. In case two object tables are applied, each provided with one or more encoder reading heads, the reading heads can be arranged to co-operate with a common linear or two-dimensional grating. As such, the relative position of both object tables can be determined. By using multiple reading heads in combination with multiple gratings, the position of the object table(s) can be determined in more than one degree of freedom (up to 6 degrees of freedom). The use of encoder systems is more extensively explained in U.S. Patent Application Publication No. 2004-0263846, incorporated herein by reference.

Embodiments of the present invention further provides in a masking device suitable to co-operate with a stage apparatus as described.

In a lithographic apparatus, a masking device is often applied to ensure that only a certain part of the pattern is imaged by the projection beam to the substrate. An example of such a masking device is described in U.S. Patent Application Publication No. 2005-0012913, incorporated herein by reference. In order to stop or to mitigate stray light from impinging on the substrate, a masking device may be applied. In a lithographic projection system, this functionality is typically achieved by providing a masking device at an intermediate plane in the illumination system.

Masking devices usually include one or more sets of movable blades. Each set of blades may be mechanically coupled to a support and each support may be mounted on a common frame. The sets of blades may be mechanically coupled or uncoupled. A masking device as described may include a first set of blades arranged to move together and apart in a scanning direction (the Y-direction), hereinafter referred to as the Y-blades, and a second set of blades is arranged to move together and apart in a direction perpendicular to the scanning direction (the X-direction), hereinafter referred to as the X-blades.

In case the masking device is applied in a lithographic apparatus provided with a stage apparatus provided with two patterns arranged adjacent to each other in the scanning direction, it may be beneficial to apply a masking device as described in the following figures.

In general, the masking device according to embodiments of the present invention includes a first masking part to obscure a first part of a first patterning device before a pattern of the first patterning device is impinged by the radiation beam, a second masking part to obscure a second part of the first patterning device after the pattern of the first patterning device is impinged by the radiation beam and to obscure a first part of the second patterning device before a pattern of a second patterning device is impinged by the radiation beam and a third masking part to obscure a second part of the second patterning device after the pattern of the second patterning device is impinged by the radiation beam.

Figure 10:
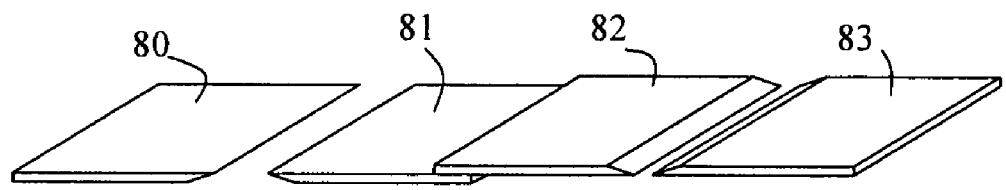
FIG. 10 schematically depicts an arrangement of four Y-blades.
Figure 11:
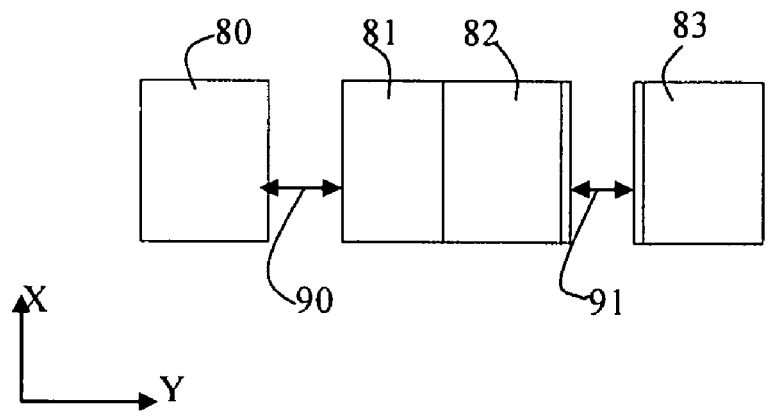
FIG. 11 schematically depicts an XY-view on the arrangement of FIG. 10.

FIG. 10 schematically depicts an arrangement of four so-called Y-blades 80, 81, 82, 83 arranged adjacent to each other in the Y-direction. The blades are displaceable in the Y-direction by, e.g., electromagnetic actuators or linear motors (not shown). FIG. 11 schematically shows an XY-view of the same blades. By displacing blades 80 and 81 relative to each other in the Y-direction, the gap 90 can be adjusted. Similar, by displacing blades 82 and 83 relative to each other in the Y-direction, the gap 91 can be adjusted.

In order to project the pattern onto a substrate, the following sequence may be applied.

Figure 12A:
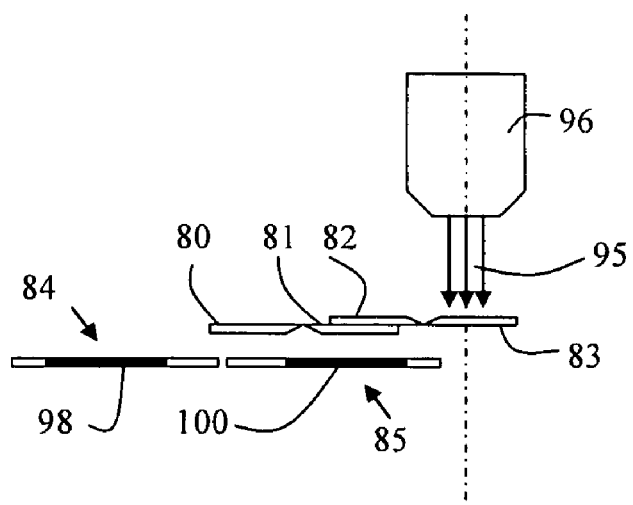
FIGS. 12a-12n schematically depict an operation sequence of a masking device according to an embodiment of the present invention.
Figure 12B:
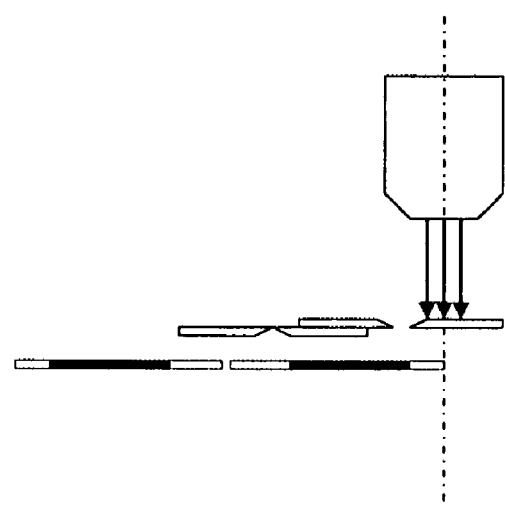
Figure 12C:
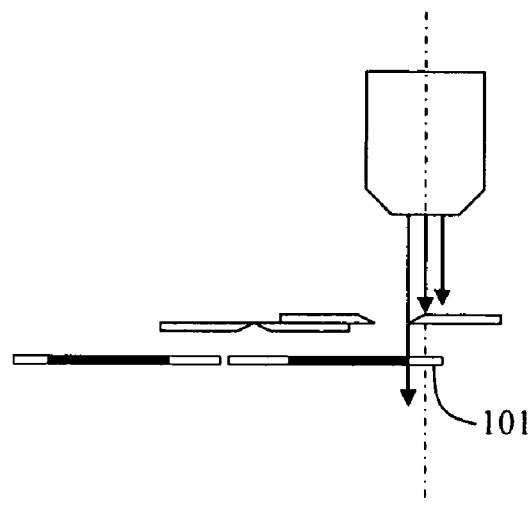
Figure 12D:
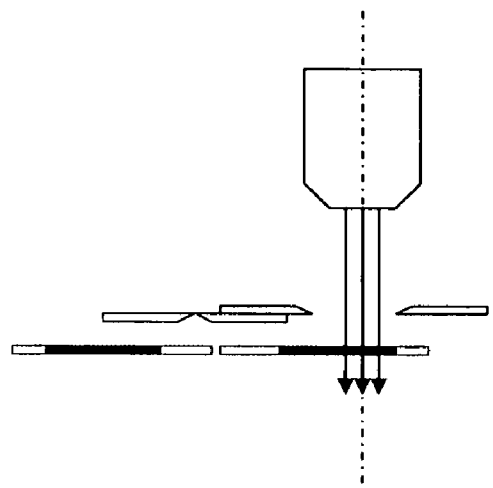
Figure 12E:
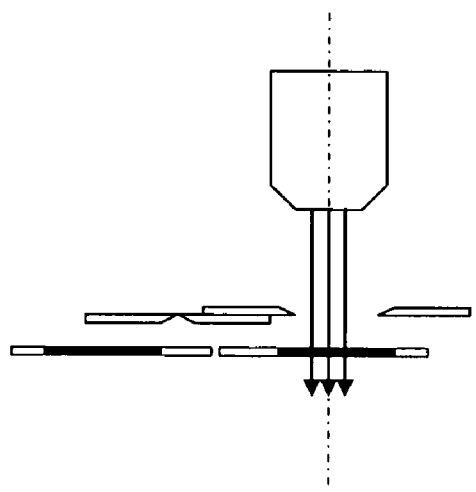
Figure 12F:
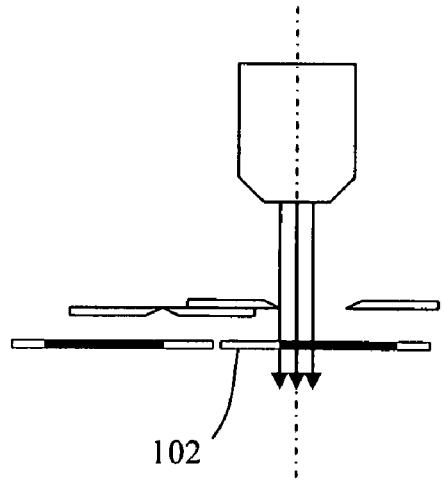
Figure 12G:
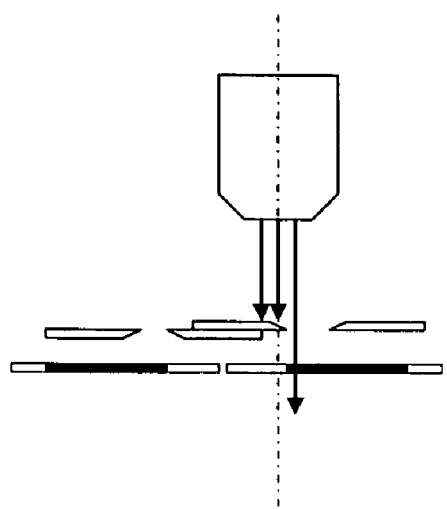
Figure 12H:
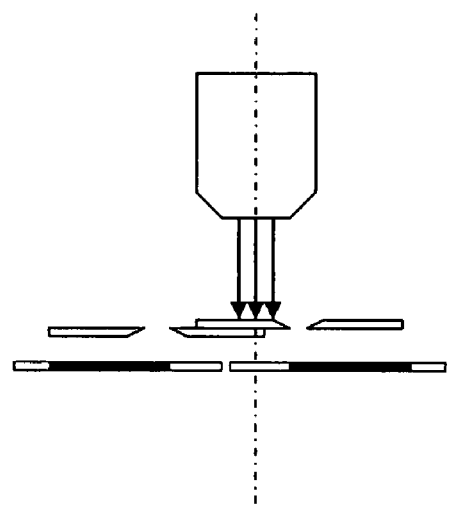
Figure 12I:
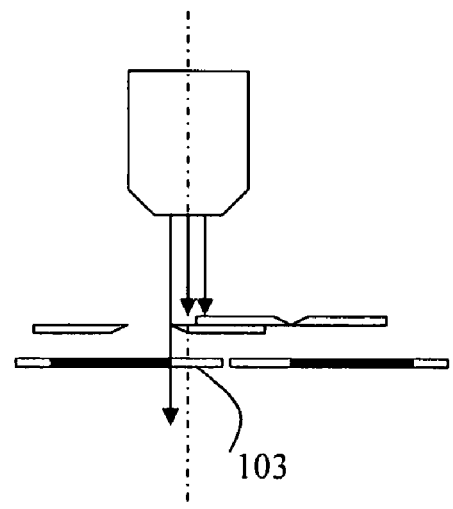
Figure 12J:
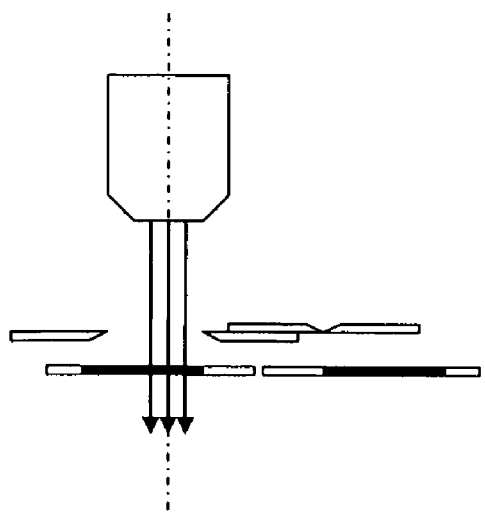
Figure 12K:
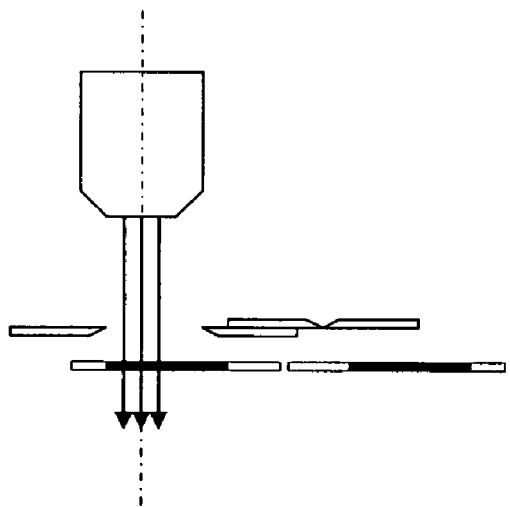
Figure 12L:
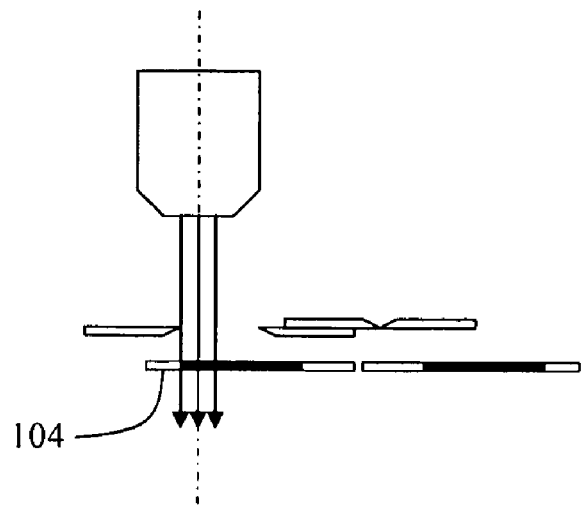
Figure 12M:
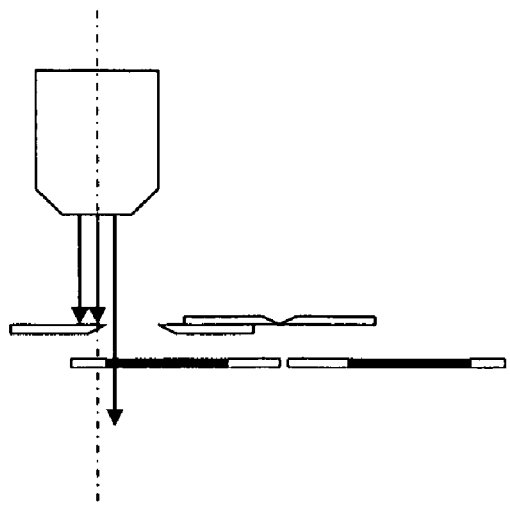
Figure 12N:
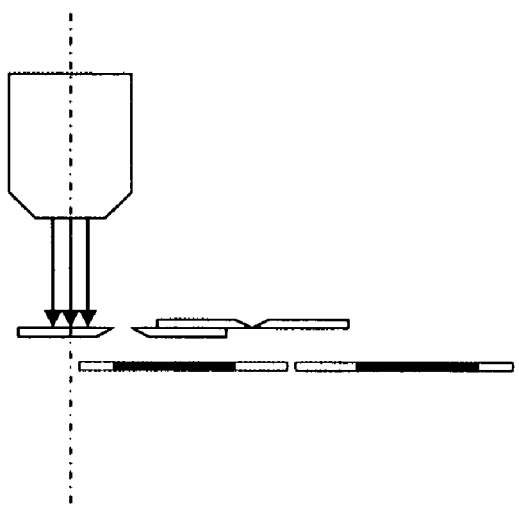

FIG. 12a schematically depicts an initial arrangement of the Y-blades, the projection beam 95 (originating from an illumination system 96), an arrangement of two patterning devices 84, 85 including a pattern 98, 100 arranged at a predefined distance apart in the Y-direction. Initially, blade 83 blocks the projection beam, the blades and the arrangement including the patterns are virtually not moving. Starting from this initial position, the arrangement including the patterns and blade 83 may accelerate (FIG. 12b) in order both to be at synchronized speed when the pattern can be impinged by the projection beam (FIG. 12c). At this point, the projection of the edge of blade 83 substantially corresponds to the edge of the first pattern, thereby obscuring a first part 101 of the first patterning device. Blade 83 and the arrangement including the patterns may subsequently proceed at their synchronized speed (FIG. 12d). At some point, blades 81 and 82 may accelerate (FIG. 12e), in order to obtain a synchronized speed and position with the second edge of the first pattern when this edge is impinged by the projection beam (FIG. 12f), thereby obscuring a second part 102 of the first patterning device. Although FIGS. 12e and 12f show that blade 80 also accelerates together with blades 81 and 82, this is not an absolute requirement. It is desired that the edge of blade 80 is synchronized with the second edge of the second pattern when this edge is impinged by the projection beam (see FIG. 12l). When blades 81 and 82 are synchronized with the arrangement including the patterns, both the blades and the arrangement may proceed at constant velocity (FIGS. 12g, 12h). Because the blades 81 and 82 are arranged in such manner that the projection of the edge of blade 81 corresponds to the first edge of the second pattern (thereby obscuring a first part 103 of the second patterning device) when the projection of the edge of blade 82 corresponds to the second edge of the first pattern, blade 81 is already in the appropriate position for the exposure of the second pattern (FIG. 12i). Once the projection beam no longer imparts the first edge of the second pattern (FIG. 12j), blades 81, 82 and 83 can be brought to a stop. Note that blade 80 is held at a position not interfering with the projection beam (FIGS. 12i, 12j). When the second edge of the second pattern approaches the projection beam, blade 80 is brought up to speed in synchronism with the arrangement including the patterns to arrive at the position depicted in FIG. 12l, thereby obscuring a second part 104 of the second patterning device. Blade 80 and the arrangement including the patterns then proceed at substantially constant speed (FIG. 12m) until the projection beam can be blocked by the blade 80 (FIG. 12n). Once this position is reached, both blade 80 and the arrangement including the patterns may start decelerating resulting in a position that is substantially the mirror-image of the position shown in FIG. 12a.

Figure 13A:
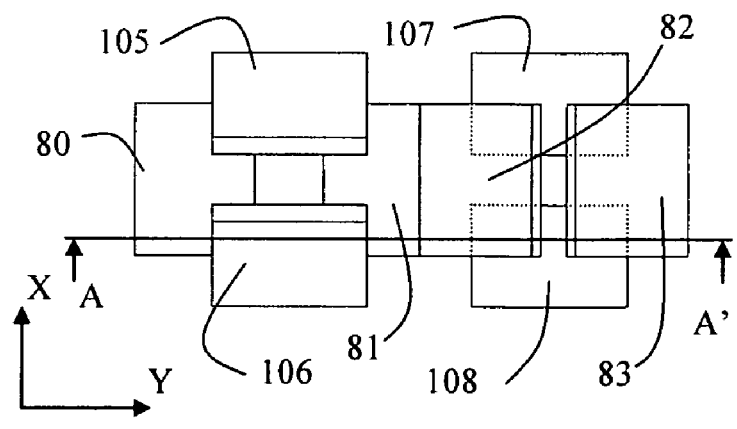
FIG. 13a schematically depicts an XY view on an arrangement of four Y-blades and four X-blades.
Figure 13B:
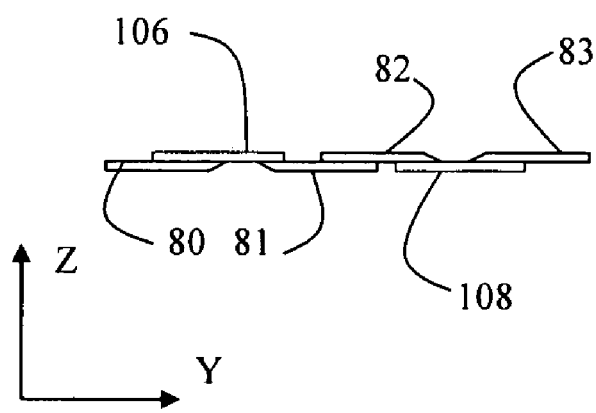

During the exposure sequence as described in FIGS. 12a-12n, the second set of blades, the X-blades remain at a predefined distance in the X-direction. An example of an arrangement of the X-blades (together with the Y-blades) is shown in FIG. 13a. FIG. 13a schematically depicts an XY-view of the four Y-blades 80, 81, 82 and 83 as shown in FIG. 11 together with four X-blades 105, 106, 107, 108. The X- and Y-blades are arranged in such manner that the edges of the blades that define the non-obscured area are substantially arranged in the same Z-plane. FIG. 13b shows the A-A' cross-section. In the arrangement as shown, the X-blades 107 and 108 also need to be displaced in the Y-direction in order to allow blade 81 to displace in the Y-direction (see FIG. 13b).

Figure 13C:
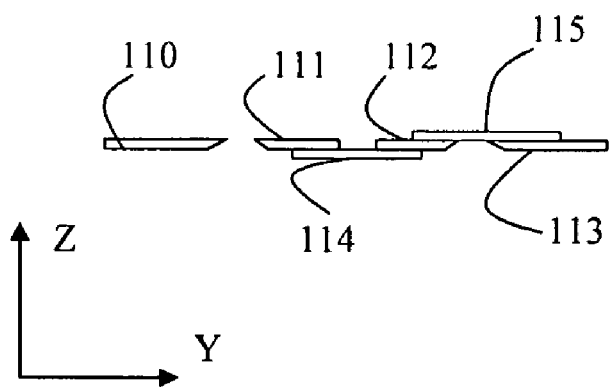
FIG. 13c schematically depicts a ZY view on an arrangement of five Y-blades and two X-blades.
Figure 13D:
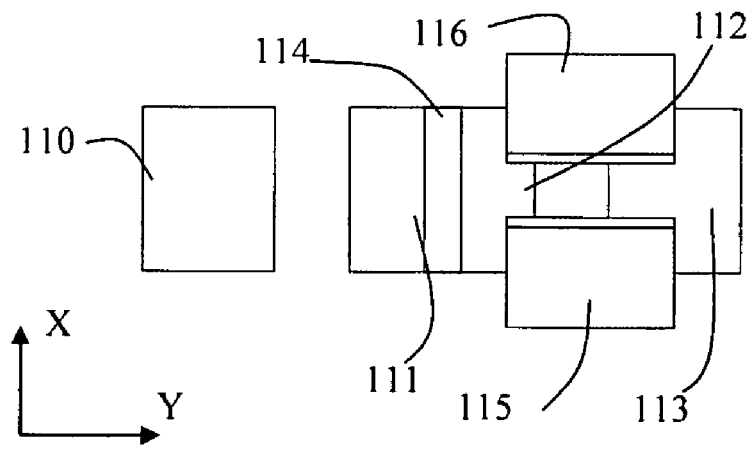
FIG. 13d schematically depicts an XY view on the arrangement of FIG. 13c.

FIG. 13c schematically depicts a YZ view of an alternative arrangement including 4 Y-blades 110, 111, 112 and 113 that are arranged at the same Z-position. Blades 110, 111, 112 and 113 can be used in a similar manner as the blades 80, 81, 82 and 83 in the sequence described in FIGS. 12a to 12n. In order to accommodate for different distances between the patterns arranged on the support, blades 111 and 112 can be made shorter than the corresponding blades 81 and 82 in the arrangement of FIG. 13b. As a consequence, a gap may occur between the blades 111 and 112 (see FIG. 13c) in the Y-direction when the blades are set to span the distance between the patterns in the Y-direction. This gap may be covered by an additional Y-blade 114 to avoid impinging of the radiation beam. As an alternative to covering the gap using an additional blade, the radiation beam can be shut during the transition of the gap between the blades. As can be seen from FIG. 13c, a displacement of the Y-blades in the Y-direction does not impose a displacement of the X-blade 115, i.e., the X-blade 115 can remain at the same Y-position during the entire exposure sequence. FIG. 13d schematically shows an XY view of the arrangement of FIG. 13c. FIG. 13d schematically shows the Y-blades 110, 111, 112 and 113, the optional Y-blade 114 and two X-blades 115 and 116.

Figure 13E:
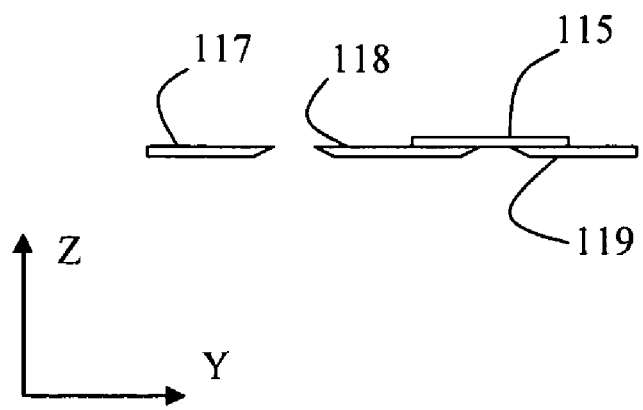
FIG. 13e schematically depicts a ZY view on an arrangement of three Y-blades and two X-blades in accordance with an embodiment of the invention.

FIG. 13e shows yet another alternative arrangement of the masking device including 3 Y-blades 117, 118 and 119. In the arrangement as shown, the Y-blade 118 can be used to follow the second edge of the first pattern (comparable to the functionality of blade 82 in FIG. 12f) during exposure of the first pattern and to follow the first edge of the second pattern (comparable to the functionality of blade 81 in FIG. 12i) during the exposure of the second pattern. As such, the blade 118 combines the functionality of blades 81 and 82 in the exposure sequence shown in FIGS. 12a to 12n. Because, in general, the length of the blade 118 in the Y-direction may not be equal to the distance between both patterns in the Y-direction, a relative displacement of the blade 118 with respect to the patterns may be required when the blade obscures the radiation beam (i.e., the situation depicted in FIG. 12h).

Figure 13F:
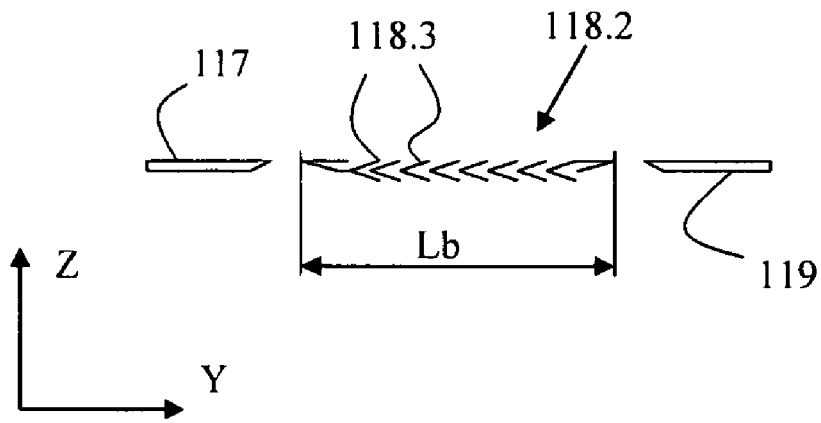
FIG. 13f schematically depicts a ZY view on an arrangement of three Y-blades in accordance with an embodiment of the invention.
Figure 13G:
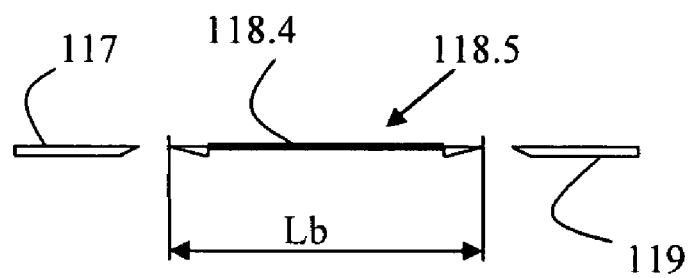
FIG. 13g schematically depicts a ZY view on another arrangement of three Y-blades in accordance with an embodiment of the invention.
Figure 13G:
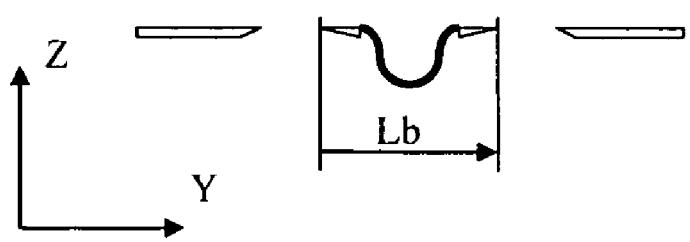

FIG. 13f shows yet another alternative of the masking device comprising 3 Y-blades 117, 119 and 118.2 of which blade 118.2 is deformable. Using such an arrangement, the length of the blade 118.2 in the Y-direction can be adjusted to correspond to the distance between both patterns in the Y-direction. In the example as shown, blade 118.2 comprises a number of segments 118.3 that are displaceable relative to each other in the Y-direction. By doing so, the effective length Lb of the blade can be changed by moving the segments closer to each other or further away. As an alternative, the blade may comprise a flexible part 118.4 allowing the effective length in the Y-direction to be varied. FIG. 13g schematically shows two positions of such an arrangement wherein blade 118.5 has a different effective length Lb in the Y-direction due to the deformation of the flexible part 118.4 of the blade. In case a deformable blade is applied, a device configured to hold and deform the blade may be incorporated in the masking device.

It should be noted that a conventional masking device may also be applied. In such an arrangement, the Y-blades have to return to their initial position during the time frame between the exposure of the first pattern and the exposure of the second pattern.

Figure 14:
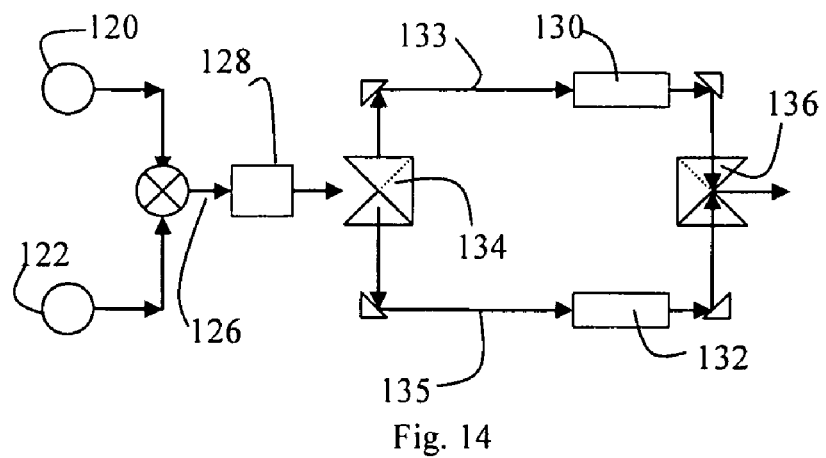
FIG. 14 schematically depicts an arrangement for redirecting a radiation beam to different parts of an illumination system.

In case a double (or multiple) exposure is desired, it may also be required to apply different illumination setting for the exposure of the patterns. In order to provide the different illumination settings during the exposure of the different patterns, the following arrangement may be applied. FIG. 14 schematically describes an arrangement of two radiation sources 120, 122. The radiation beams originating from these sources are combined into one radiation beam 126 that may be applied in an (optional) first illuminator part 128 after which the radiation beam is sent to either illumination unit 130 or illumination unit 132 using a device 134. As such, the optical path of the illumination system includes a first branch 133 via the illumination unit 130 and a second branch 135, parallel to the first branch, via the illumination unit 132. In these illumination units, different settings may be applied (e.g., dipole illumination in one part 130 and quadrupole illumination in the other part 132 or dipole illumination in both parts but with a different orientation). The outcoming radiation beams of either part 130 or 132 are further projected to the same location by a second device 136 that may be identical to the device 134. The device 136 ensures that the appropriate beam (either the beam originating from illumination unit part 130 or the beam originating from the illumination unit 132) is imparting the appropriate pattern. As such, the radiation beam originating from the (optional) illuminator part 128 is directed to either the first branch 133 or the second branch 135, such that the radiation beam may be configured by the first illumination unit during the exposure of a first exposure field with a pattern of a first patterning device and that the radiation beam is configured by the second illumination unit during the exposure of a second exposure field with a pattern of a second patterning device.

Figure 15:
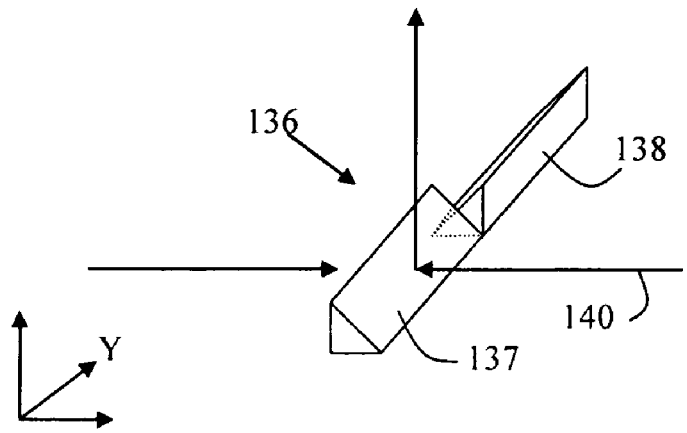
FIGS. 15 and 16 schematically depict a device for redirecting a radiation beam.
Figure 16:
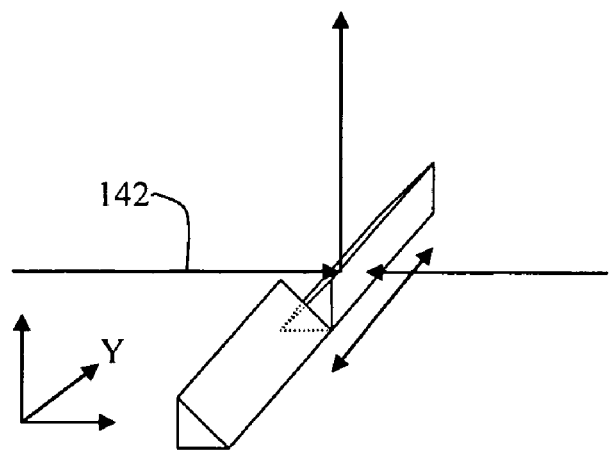

An example of such a device 136 (and device 134) is shown in FIG. 15. FIG. 15 schematically depicts a device 136 including two prisms 137, 138 arranged adjacent to each other in the Y-direction. The prisms 137 and 138 may be displaced along the Y-direction using an actuator or a linear motor (not shown). When the device 136 is in a position as shown relative to a radiation beam 140, this beam can be deflected into the Z-direction. In case the prisms are displaced along the Y-direction (as shown in FIG. 16) the radiation beam 142 (which is parallel to beam 140) can be deflected into the Z-direction. Using this device, two beams originating from different illumination units may be projected alternating on to a patterning device. This can be achieved by synchronously displacing the device 134 and the arrangement including the patterning devices.

Figure 17:
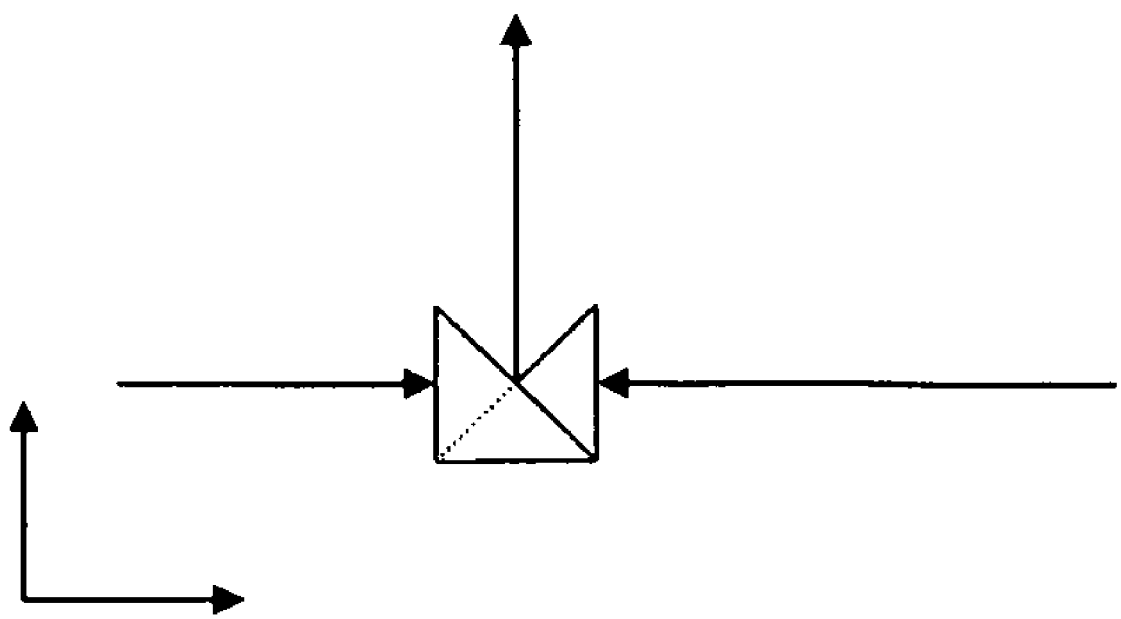
FIG. 17 schematically depicts a front view of the arrangement of FIGS. 15 and 16.

FIG. 17 shows an XZ-view of the device 136 (or 134).

The prisms 137, 138 of the device 136 (or 134) shown in FIGS. 15 to 17 may be directly connected to one another. Alternatively, there may be a gap between the prisms 137, 138, the prisms being connected by a connector which passes between them. In a further alternative embodiment, there may be no connector passing between the prisms 137, 138. Where this is done some connection may be provided elsewhere, such that the prisms 137, 138 move in unison.

It should be noted that the arrangement as shown in FIG. 14 may also be applied using a single radiation source provided that this source is powerful enough. As can be seen from eq. 3b, the optimized speed of the stage apparatus is substantially higher than in a conventional lithographic apparatus. As a consequence, a more powerful radiation source may be desired to expose the substrate with the appropriate dose. In order to provide such a powerful radiation source, an arrangement as shown in FIG. 14 may be applied.

It should further be noted that the arrangement of FIG. 14 may be provided with two conventional masking devices arranged in the illumination units 130 and 132, rather than applying a masking device as described in FIGS. 10 to 13e.

Figure 18A:
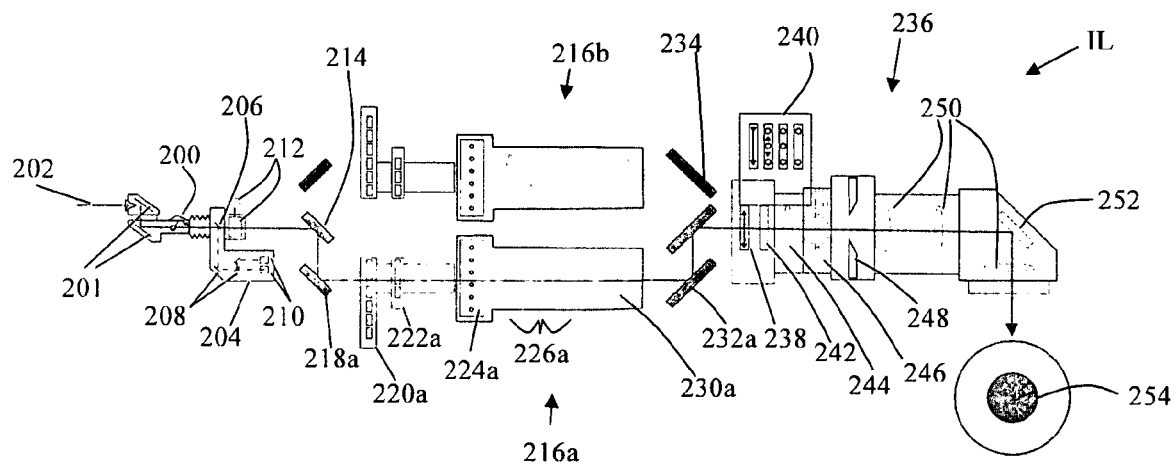
FIGS. 18a-b schematically depicts an illuminator according to an embodiment of the invention.
Figure 18B:
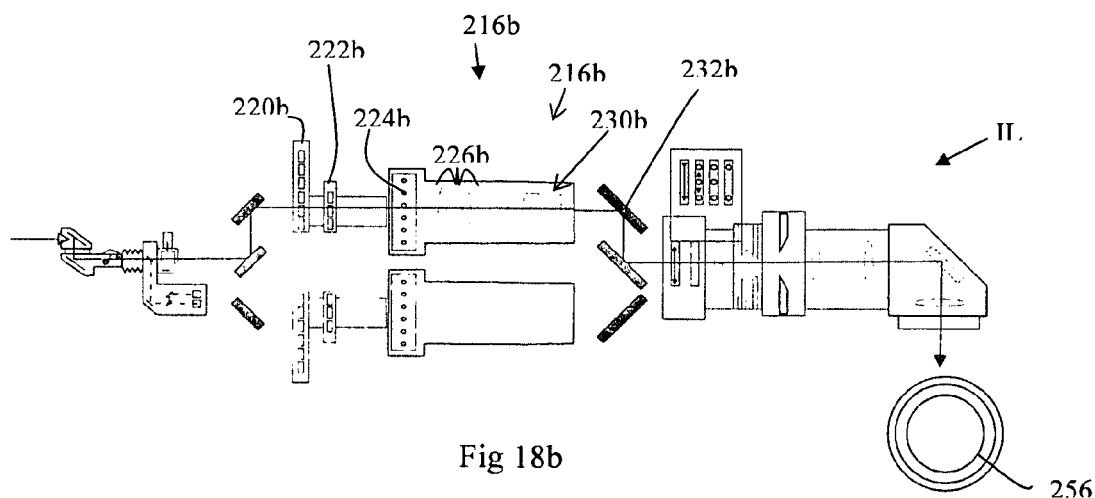

FIGS. 18a-b show schematically an alternative arrangement which may be used to provide different illumination settings during the exposure of different patterns, in accordance with an embodiment of the invention. An illuminator IL shown in FIG. 18a includes two optical channels in which certain optical elements are duplicated, and other parts in which optical elements are provided only once.

The illuminator IL includes a polarizer 200 arranged to clean up the polarization of a beam of radiation 202 provided by one or more optical sources (not shown). A pair of beam steering mirrors 201 are provided upstream of the polarizer 200, and allow adjustment of the direction of the beam of radiation 202. The illuminator further includes a beam measurement unit 204 which includes a mirror 206 arranged to direct a small fraction of the beam 202 towards mirrors 208 and from there to a pair of photodiodes 210 (the photodiodes are arranged to measure the location and orientation of the radiation beam). A variable attenuator 212 is provided adjacent to the beam-measuring unit 204. The variable attenuator 212 may be automatically actuated based upon output from the photodiodes 210, for example in order to maintain the energy of the radiation beam at a substantially constant level.

The illuminator IL further includes a first switching device 214 which is arranged to alternately direct the beam of radiation 202 in opposite directions. The first switching device 214 may for example correspond with that described above in relation to FIG. 15 (a pair of prisms with reflective faces oriented in different directions). Downstream of the first switching device 214 the illuminator separates into two parallel channels 216a, 216b. Referring to the lowermost illuminator channel 216a in FIG. 18a (hereafter called the first illuminator channel 216a), a steering mirror 218a is arranged to direct the beam of radiation 202 through a diffractive optical element 220a and a polarizer 222a. The diffractive optical element 220a is held by an exchanger mechanism (not shown) which allows the diffractive optical element to be replaced with one or more alternative diffractive optical elements. Similarly, the polarizer 222a is held by an exchanger mechanism (not shown) which allows the polarizer 222a to be exchanged with one or more other polarizers.

The first illuminator channel 216a further includes an arrangement of spokes 224a which extend radially with respect to the beam and may be moved into and out of the beam, to provide intensity adjustments of the beam. The first illuminator channel 216a further includes zoom optics 226a with at least one moveable element. This is shown schematically as a pair of convex lenses. However this is for ease of illustration only, and it will be appreciated that the zoom optics 226a may include several lenses, for example six lenses. The zoom optics 226a are arranged to provide expansion of the radiation beam 202 in a controlled manner, the position of the moveable element (or more than one moveable element) determining the size of the radiation beam.

The first illuminator channel 216a is provided with an optical system referred to here after as an axicon 230a. The axicon 230a includes two elements having conical shaped faces of complimentary forms. The axicon allows the radiation beam 202 to be adjusted between different annular spatial intensity distributions, or other spatial intensity distributions. The distance between the two elements of the axicon 230a may be adjusted by moving one of the elements along the direction of the optical axis. This allows the annularity of the radiation beam to be adjusted. When the axicon 230a is closed, i.e. the gap between the conical faces is zero, the radiation beam may have a disk shape. When a gap is present between the conical faces of the axicon 230a, an annular intensity distribution may result, the inner radial extent of the annulus being determined by the distance between the two conical faces.

The final optical element of the first illuminator channel 216a is a mirror 232a which is arranged to direct the radiation beam 202 towards a second switching device 234.

The other illuminator channel 216b (hereafter called the second illuminator channel) includes optical elements which correspond generally to those described above in relation to the first illuminator channel 216a. However, the diffractive optical elements 220b and polarizer 222b may have different settings (for example different polarizations). Similarly, the moveable element(s) of the zoom optics 226b may have positions which are different to their positions in the first illuminator channel 216a, and the elements of the axicon 230b may have a different separation.

The second switching device 234 may for example correspond with that described above in relation to FIG. 15 (a pair of prisms with reflective faces oriented in different directions). The second switching device 234 is arranged to alternate between a first position which directs the radiation beam 202 from the first illuminator channel 216a towards an additional part of the illuminator 236, and a second position which directs the radiation beam 202 from second illuminator channel 216b towards the additional illuminator part 236. The operation of the first and second switching devices 214, 234 is synchronised, as can be seen schematically by comparing FIG. 18a and FIG. 18b.

The additional illuminator part 236 includes a polarization shaping element 238 is held by an exchanger mechanism 240, which may swap the polarization shaping element with one or more other polarization shaping elements having different properties. A field defining element 242 is provided next to the polarization shaping element, and a field lens 244 is provided beyond this.

The illuminator IL further includes a uniformity correction apparatus 246 which is includes one or more filters arranged to reduce any non-uniformity which is present in the cross-section of the radiation beam 202. Examples of uniformity correction apparatus are disclosed in US2005/0140957 (see for example FIG. 11 therein). The illuminator includes masking blades 248 similar to those described above in relation to FIG. 13. Finally, the illuminator IL includes an imaging optical system 250 arranged to image the masking blades onto a mask MA (see FIG. 1), including a mirror 252 which folds the radiation beam 202 through 90 degrees. Although the imaging optical system 250 is shown as including three convex lenses, this is for ease of illustration only, and any other suitable combination of lenses may be used. The imaging optical system 250 may have a magnification of one, or of some other value.

In FIG. 18a, the radiation beam 202 is directed by the switching device 214 through the first illuminator channel 216a. The position(s) of the moveable element(s) of the zoom optics 226a, and the separation between the elements of the axicon 230a, of the first illuminator channel is such that the radiation beam takes the form of a disk 254 in a pupil plane. In FIG. 18b, the radiation beam 202 is directed through the second illuminator channel 216b. The position(s) of the moveable element(s) of the zoom optics 226b, and the separation between the elements of the axicon 230b, of the second illuminator channel 216b are such that the radiation beam 202 takes the form of an annulus 256 in a pupil plane.

Using the switching devices 214, 234 the radiation beam 202 may be alternated between the illuminator channels 216a, 216b such that the illuminator delivers a beam of radiation which alternates between the disk 254 and the annulus 256. The switching devices 214, 234 of FIGS. 18a-b form a switching mechanism. These may be provided with different polarizations using the polarizers 222a, 222b. The disk and/or annulus may be replaced with a different shape by changing either or both of the diffractive optical elements 220a, 220b (for example a dipole or quadrupole shape may be formed). The intensity distribution of the radiation beam may be adjusted using the spoke arrangements 224a, 224b.

The arrangement illustrated in FIGS. 18a-b differs from that illustrated in FIG. 14 in that some elements of the illuminator IL are provided only once, instead of providing two separate illuminators in which each illuminator element is duplicated. Only those illuminator elements which are to be separately adjusted in order to provide different radiation beam properties are provided in two illuminator channels. Those illuminator elements are the diffractive optical elements 220a, 220b (which adjust the beam's angular distribution (or equivalently pupil shape)), the polarizers 222a, 222b (which adjust the beam's polarization), the spoke arrangements 224a, 224b (which adjust the beam's energy distribution in a pupil plane), the zoom optics 226a, 226b and the axicon 230a, 230b (which together adjust the beam's angular distribution (or equivalently pupil shape)). The arrangement shown in FIG. 18 allows convenient switching between radiation beams 202 with different properties, but is less expensive than providing two entire illuminators.

Illuminator elements which are not to be separately adjusted are provided only once, in the additional illuminator part 236. These elements are the polarization shaping element 238 (which adjusts the beam's polarization), the field defining element 242 (which adjusts the beam's intensity distribution in a field plane (or equivalently short uniformity)), the field lens 244, the uniformity correction apparatus 246 (which adjusts the beam's intensity distribution in a field plane (or equivalently short uniformity)), the masking blades 248 (which adjust the beam's field size), and the imaging optical system 250 (which magnifies the field size created by the masking blades 248 to a required size (the magnification may be by a factor of 1)).

Other illuminator elements which are not to be separately adjusted are provided only once in a further illuminator part, prior to the illuminator channels 216a, 216b. These are the polarizer 200 (which cleans up the polarization of the beam), the beam steering mirrors 201 (which adjust the direction of the beam), and the variable attenuator 212 (which adjusts the energy of the radiation beam, for example to maintain it at a substantially constant level).

Although the polarization shaping element is described as being provided in the additional illuminator part 236, it may alternatively or additionally be provided in illuminator channels 216a, 216b.

An energy sensor arranged to measure the energy of the beam may be provided in each of the illuminator channels 216a, 216b, for example behind the mirrors 232a, 232b (the mirrors may be arranged such that a small proportion of the radiation beam passes through them to the energy sensors).

The illuminator may form part of a lithographic apparatus which includes more than one patterning device. An example of such a lithographic apparatus is described above in relation to FIG. 2.

Figure 19A:
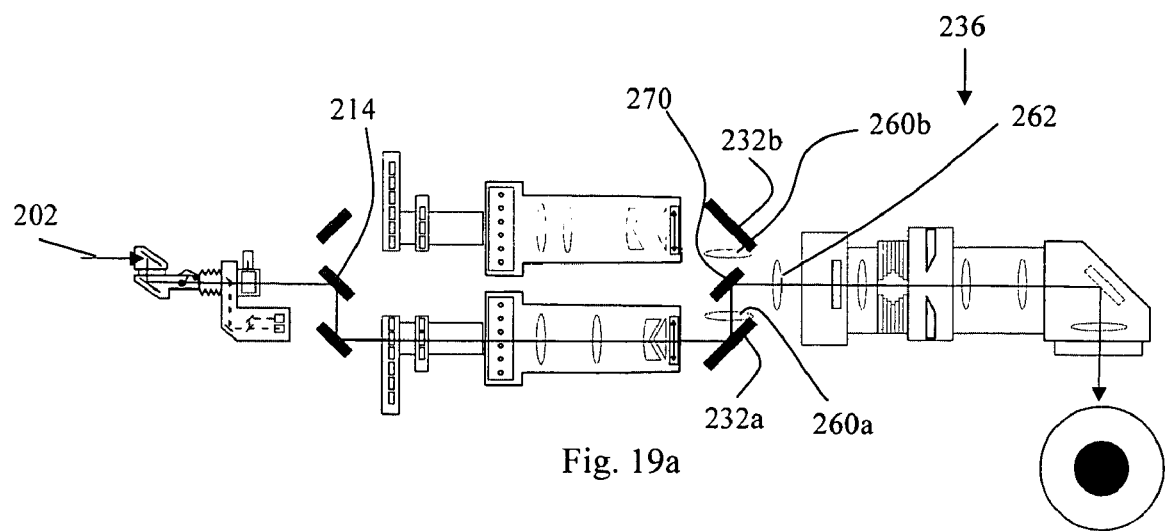
FIG. 19a-b schematically depicts the illuminator of FIG. 18 with modified components in accordance with an embodiment of the invention.
Figure 19B:
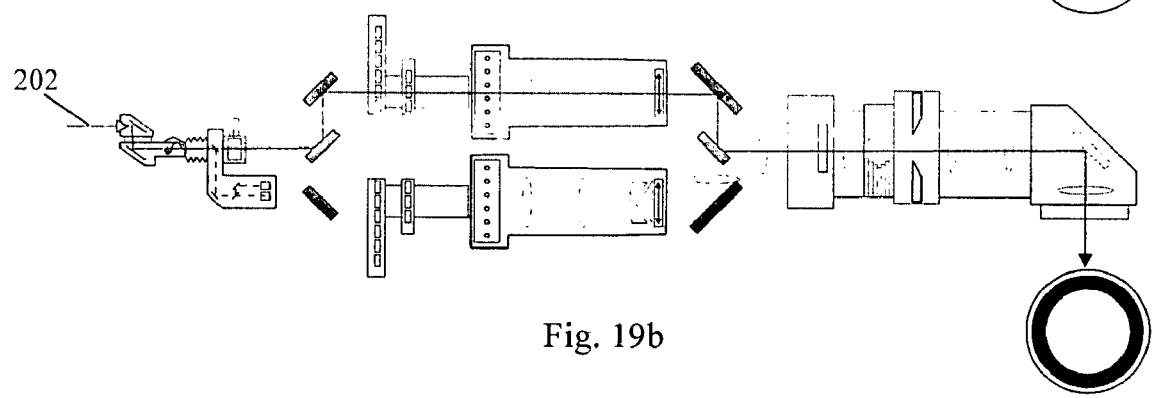

Referring to FIGS. 19a-b, convex lenses 260a, 260b may be provided between the mirrors 232a, 232b and the second switching device 270. The convex lenses 260a, 260b are arranged to focus the radiation beam 202 such that the beam has a significantly smaller cross sectional area when it is incident upon the second switching device 270. The second switching device 270 may thus have a significantly smaller surface area than the second switching device 234 provided in the apparatus described above in relation to FIGS. 18a-b. The switching devices 214, 270 of FIGS. 19a-b form a switching mechanism.

A further convex lens 262 is provided between the second switching device 270 and the additional illuminator part 236. The convex lens 262 expands the cross section of the radiation beam 202, for example so that it has a cross sectional area which corresponds to the cross sectional area of the radiation beam when it is incident upon the mirrors 232a, 232b.

In conventional optical terminology, it may be said that the convex lenses 260a, 260b are arranged to focus the radiation beam 202 from a pupil plane to a significantly smaller field plane. The second switching device 270 may be in or close to the field plane. The additional convex lens 262 is arranged to return the radiation beam 202 to a significantly larger pupil plane. It will be appreciated that although convex lenses 260a, 260b, 262 are used to reduce and then expand the radiation beam 202, other suitable optical components may be used. In general terms, an optical system which reduces and then expands the radiation beam 202 is used.

Since the second switching device 270 is smaller (compared with the second switching device of FIG. 18), it may be less heavy. This allows the second switching device 270 to be switched more rapidly between the configuration shown in FIG. 19a and the configuration shown in FIG. 19b. The cross sectional area of the radiation beam 202 when it is incident upon the first switching device 214 is small (the radiation beam has not yet passed through the illuminator channels 216a, 216b which expand the radiation beam), and so the first switching device 214 may have the same dimensions (and weight) as the second switching device 270. This allows the first and second switching devices 214, 270 to operate at the same speed.

Figure 20:
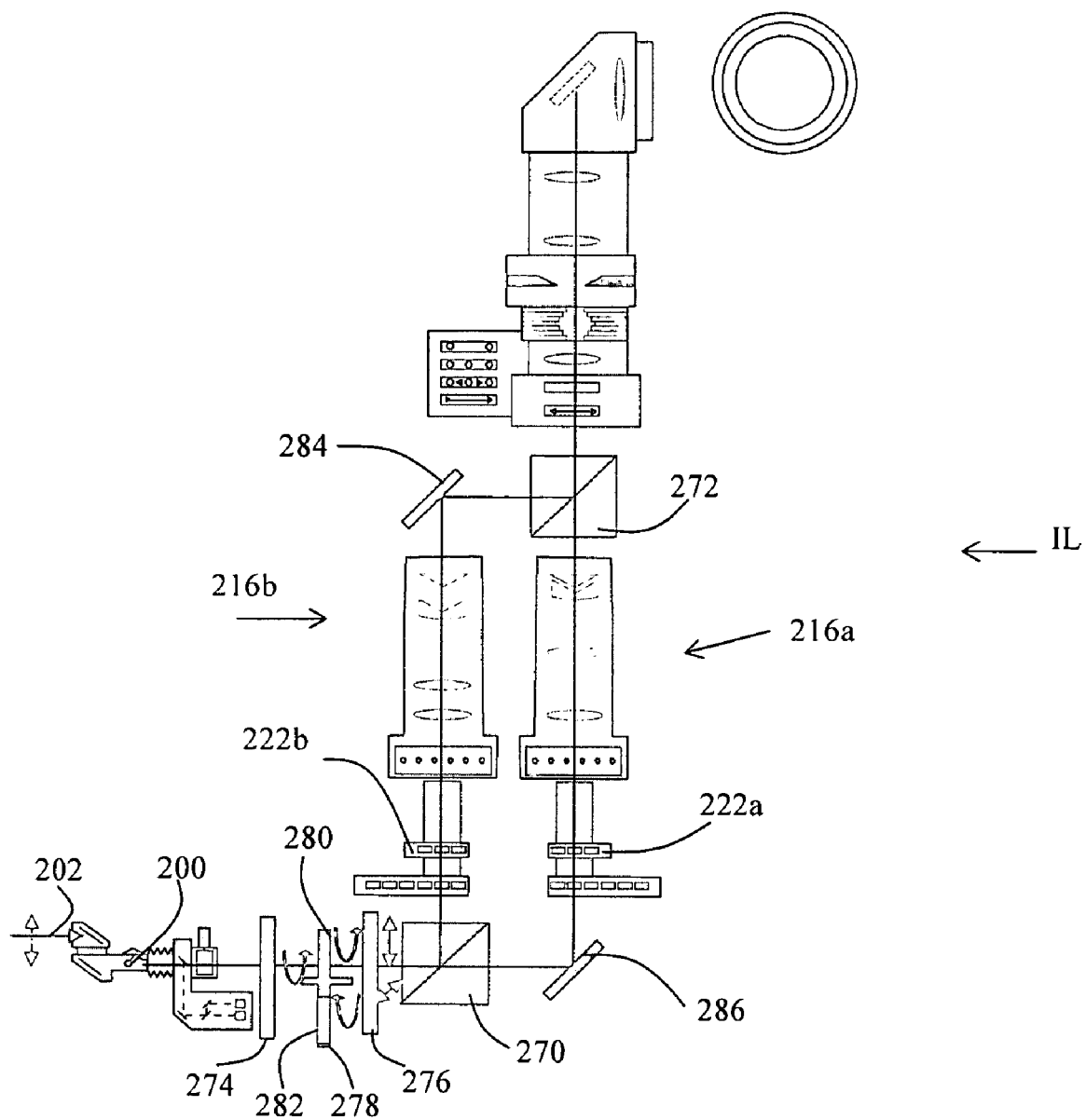
FIG. 20 schematically depicts the illuminator of FIG. 18 with alternative components in accordance with an embodiment of the invention.

An alternative switching device or switching mechanism, which may be used in place of using the switching devices 214, 234, 264 of FIGS. 18a-b and 19a-b, is illustrated in FIG. 20. FIG. 20 shows an illuminator IL including first and second optical channels 216a, 216b. With the exception of the switching device, the components of the illuminator IL correspond with those described above in relation to FIG. 18, and will not be described again in relation to FIG. 20. The switching device includes first and second polarizing beam splitter cubes 270, 272 located at either end of the optical channels 216a, 216b. The switching device further includes first and second ¼ wave plates 274, 276 located before the first polarizing beam splitter cube, and a rotatable plate 278 located between the ¼ wave plates. The rotatable plate 278 is provided with a first region 280 which has a transparent window and a second region 282 which has a ½ wave plate.

In use, a radiation beam 202 is generated by a radiation source (not shown) the radiation beam having linear polarization. In the illustrated example a grey arrow overlapping the radiation beam 202 indicates that the polarization is in the plane of FIG. 20. The polarization of the radiation beam 202 is cleaned up by the polarizer 200 and then passes to the first ¼ wave plate 274. The ¼ wave plate 274 converts the linear polarization of the radiation beam 202 to circular polarization, as indicated by a curved grey arrow. The circularly polarized radiation beam 202 then passes through the transparent window 280 of the rotatable plate 278. The polarization of the radiation beam 202 is unchanged when it passes through the transparent window 280, as indicated by the curved grey arrow. The circularly polarized radiation beam 202 then passes through the second ¼ wave plate, whereupon the polarization is converted to linear polarization in the plane of the FIG. 20 as indicated by the grey arrow. This linearly polarized radiation is reflected by the first polarizing beam splitter cube 270 and passes through the second illuminator channel 216b. The radiation beam is then passes via a mirror 284 to the second polarizing beam splitter cube 272, from where it is reflected into the remainder of the illuminator IL.

In order to switch the radiation beam 202 into the first illuminator channel 216a, the rotatable plate 278 is rotated until the radiation beam passes through the ½ wave plate 282. This has the effect of reversing the direction of circular polarization of the radiation beam 202, as shown schematically by the lowermost curved gray arrow. The radiation beam, upon passing through the second ¼ wave plate 276, becomes linearly polarized, the plane of the polarization being transverse to the plane of FIG. 20. Linear polarization of this orientation is transmitted by the first polarizing beam splitter cube 270. The radiation beam 202 thus passes via a beam steering mirror 286 into the first illuminator channel 216a. Upon leaving the first illuminator channel 216a, the radiation beam 202 passes through the second polarizing beam splitter cube 272 and into the remainder of the illuminator IL.

The rotatable plate 278 allows rapid and convenient switching of the radiation beam 202 between the first and second illuminator channels 216a, 216b. The rotatable plate 278 may be automatically actuated, for example by a motor controlled by a processor. In one example, the transparent window 280 may occupy half of the working optical area of the rotatable plate 278, and the ½ wave plate 282 may occupy the other half. Rotating rotatable plate 278 at a desired speed will then cause the radiation beam 202 to alternate between the first and second optical channels 216a, 216b at a desired rate.

The switching device shown in FIG. 20 has a low light loss, the loss arising due to the non-perfect operation of the wave plates 274, 276, 278 and the polarizing beam splitter cubes 270, 272.

The rotatable plate 278 is a convenient apparatus to switch between the transparent window 280 and the ½ wave plate 282. However, it will be appreciated that other apparatus may be used. For example, a translatable plate which includes a transparent window and a ½ wave plate may be used. In general, the plate is moveable from a first position in which the radiation beam 202 passes through a transparent window (or some other window that does not affect the beam's polarization) and a second position in which the radiation beam passes through a ½ wave plate.

The first and second optical channels 216a, 216b include polarizers 222a, 222b. These polarizers should not be used to modify the polarization of the radiation beam 202, as this will cause the second polarizing beam splitter cube 272 to direct part of the radiation beam 202 away from the remainder of the illuminator IL. If it is desired to adjust the polarization of the radiation beam 202 using the polarizers 222a, 222b then the polarizing beam splitter cube 272 may be replaced by for example a 50% reflective mirror. This will ensure that 50% of the radiation beam 202 passes to the remainder of the illuminator, although fifty percent of the radiation beam will be lost. Alternatively, the second polarizing beam splitter cube 272 may be replaced by a different switching device, for example of the type described above in relation to FIGS. 18 and 19.

The second polarizing beam splitter cube 272 is located at or near a pupil plane, with the effect that the angles at which radiation are incident upon it are sufficiently small that the polarization of the radiation beam 202 is not affected.

In a further alternative arrangement, the first and second ¼ wave plates 274, 276 and the rotatable plate 278 may be replaced with a rotatable ½ wave plate (not shown). By rotating the ½ wave plate, the polarization of the radiation beam 202 may be switched from being in the plane of FIG. 20 to being transverse to FIG. 20, thereby switching the radiation beam between the first and second optical channels 216a, 216b. Switching between the first and second illuminator channels 216a, 216b when using the ½ wave plate will be gradual rather than binary, in the sense that the intensity of radiation in a given illuminator channel will vary continuously as the ½ wave plate is rotated (for example following a sine wave distribution or similar).

The ½ wave plate may be automatically actuated, for example using a motor controlled by a processor, and may be arranged to move between predetermined positions, or alternatively may be arranged to rotate at a desired speed.

When switching the radiation beam 202 using one or more polarization controlling wave plates, the direction of the radiation beam may be more stable than if the radiation beam were to be switched using a mirror based switching device. This is because there are no moving reflective surfaces. In addition, since the switching is achieved by rotation of a plate rather than by linear motion of mirrors, it may be faster and mechanically more reliable.

The ¼ wave plates 274, 276 and the rotatable plate 278 may be replaced by a pockels cell. The pockels cell may be used to switch the polarization of the radiation beam 202 between linear polarization which is in the plane of FIG. 20 and linear polarization which is transverse to FIG. 20. The pockels cell is controlled by applying a modulated voltage to the pockels cell, which may for example be controlled by a processor. The pockels cell allows rapid switching of the radiation beam 202 between the first and second illuminator channels 216a, 216b to be performed.

In some instances it may be desired to fill the pupil of the projection system PS (see FIG. 1) with the radiation beam 202, so that a radiation beam having a sigma of 1 passes through the projection system PS. This may be useful if for example a sensor is located on the substrate table WT for detecting properties of the radiation beam 202 at the substrate table. The sensor may be arranged to detect for example aberrations in wavefronts of the radiation beam 202.

Figure 21:
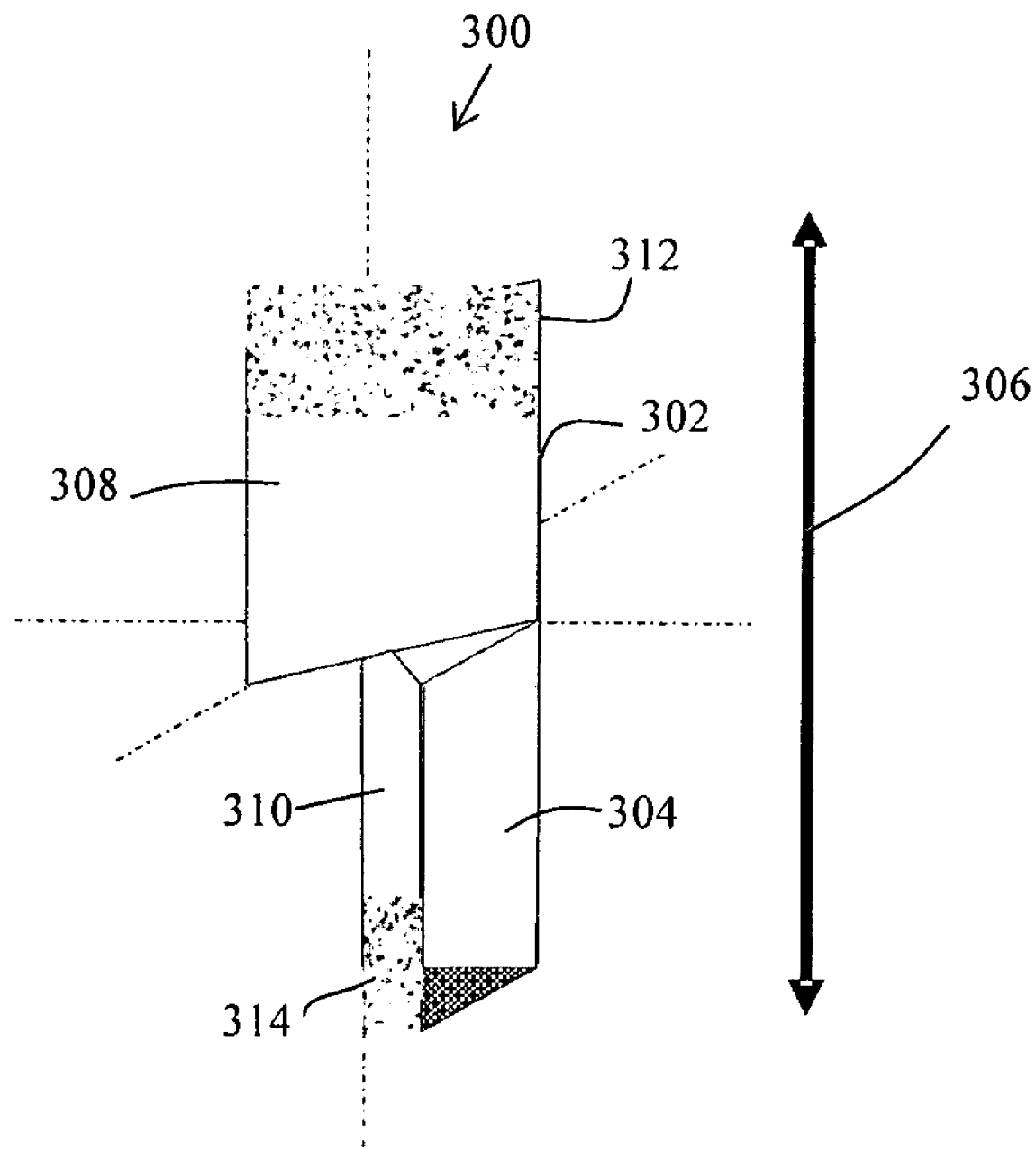
FIG. 21 schematically depicts the device shown in FIGS. 15 and 16 with modified reflective surfaces in accordance with an embodiment of the invention.

FIG. 21 shows schematically a switching device of the type shown in FIG. 15, the switching device being modified to generate diffused light. Referring to FIG. 21, a switching device 300 includes first and second prisms 302, 304 which are connected together and are translatable in a direction indicated by double headed arrow 306. The switching device 300 may for example be used in place of the second switching device 234, 270. The first prism 302 includes a reflective face 308, and the second prism 304 includes a reflective face 310 having a different orientation. The reflective face of the first prism 302 includes a diffusely reflecting region 312. The diffusely reflecting region 312 is not illuminated during normal lithography (i.e. projection of a functional pattern from a mask MA onto a substrate W). However, if it is desired for example to provide radiation with a sigma of 1, then the switching device is moved such that the radiation beam 202 is reflected from the diffusely reflecting region 312. The radiation beam 202 is thereby converted into diffuse light, which fills the pupil of the projection system PL. This allows, for example, aberration measurements to be made by a sensor located on the substrate table WT.

A diffusely reflecting region 314 is provided on the reflective face 310 of the second prism 304. This allows the same measurement to be made for a radiation beam incident upon the switching device 300 from an opposite direction.

Diffusely transmitting elements (not shown) may be used to generate the diffuse radiation instead of using diffusely reflecting regions 312, 314. The diffusely transmitting elements may for example be located over suitable regions of the reflective faces 308, 310 of the prisms 302, 304.

Figure 22:
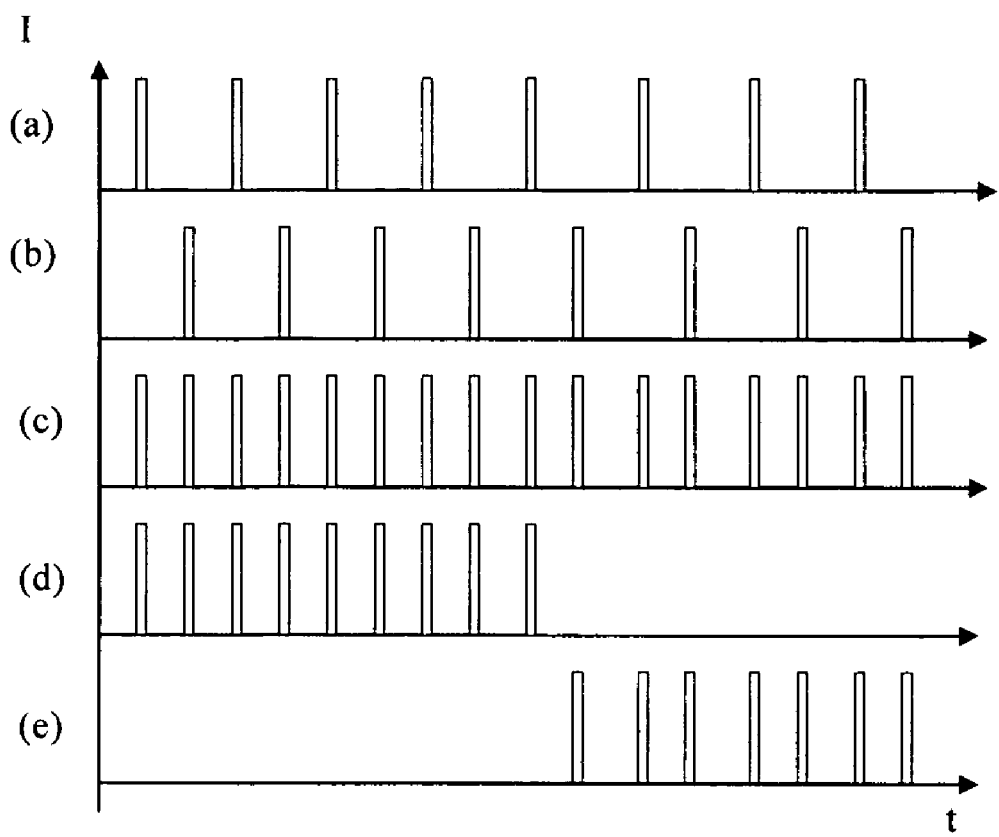
FIG. 22 schematically depicts the time domain graphs of radiation pulses origination of two radiation sources, the combined array of pulses and the arrays of pulses sent to one of two illumination units.

FIG. 22 schematically depicts the radiation pulses of both radiation sources 120 (graph a) and 122 (graph b) as a function of time together with the combined radiation beam (graph c). Using the device 134 (see FIG. 14) part of the combined radiation beam may be sent to illuminator part 130 (graph d) or to illuminator part 132 (graph e)

A benefit of the arrangement using the devices 134 and 136 is that these devices are comparatively small and light. Therefore, a comparatively small actuator or linear motor may be sufficient to displace the devices. The devices 134 and 136 may also be driven by a common actuator or motor.

Figure 23:
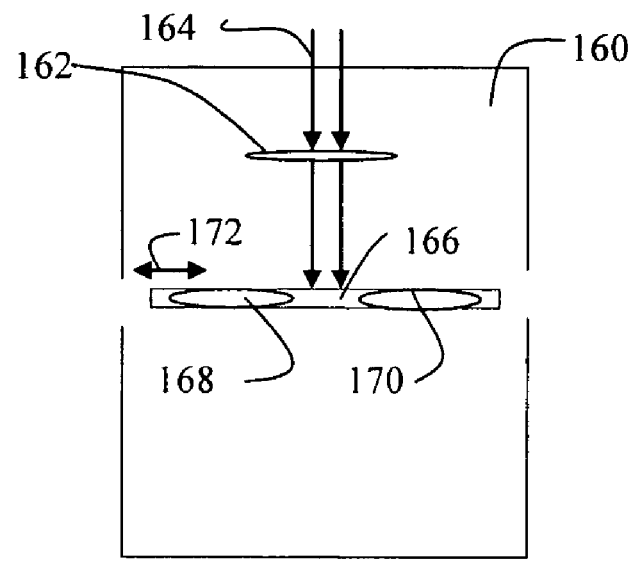
FIG. 23 schematically depicts an illumination unit including a number of optical elements and a holder for holding two optical elements.

Alternatively, rather than redirecting the radiation beam to either an illumination unit 130 or an illumination unit 132, an arrangement as depicted in FIG. 23 may be applied. FIG. 23 schematically depicts an illumination system 160 including a number of optical elements 162 that may be impinged by a radiation beam 164. The illumination system further includes a holder 166 for holding two (or more) optical elements 168, 170. The optical elements may be arranged adjacent to each other. The arrangement may include an actuator or linear motor for displacing the holder 166 with the optical elements in the direction indicated by the arrow 172. By doing so, one can ensure that the radiation beam impinges the optical element 168 during the exposure of a first pattern of an arrangement as shown in FIGS. 12a-12n, and that the radiation beam impinges the second optical element 170 during the exposure of a second pattern of the arrangement as shown in FIGS. 12a-12n. Alternatively, the optical elements may be mounted on a rotating disc driven by a rotary motor.

The arrangement of FIG. 23 enables the use of only one illumination system. In case more than one optical element needs to be changed between both exposures, further holders can be applied. Those multiple holders may be driven by the same actuator. It should be noted that, alternatively, the illumination system may be provided with a holder for each optical element rather than having a common holder for both elements. Each of the holders may be driven either independently by, e.g., a linear motor or they may be driven by a common linear motor.

As an example, the arrangement as shown in FIG. 23 may be applied to use different 'diffractive optical elements' during the exposure of the first and second patterns. Such elements may be applied to change the intensity distribution of a radiation beam of the illumination system. In order to change between a first intensity distribution for the exposure of the first pattern and a second intensity distribution for the exposure of the second pattern, the holder 166 of the arrangement of FIG. 23 may include two diffractive optical elements arranged adjacent to each other. In order to ensure that the appropriate intensity distribution is applied, the holder 166 including the diffractive optical elements can be displaced in synchronism with the stage provided with the first and second pattern such that the radiation beam impinged or reflected by the first diffractive optical element during the exposure of the first pattern and that the radiation beam impinges or is reflected by the second diffractive optical element during the exposure of the second pattern.

It should be noted that in case the optical elements are arranged in a field plane of the illumination system, they are allowed to displace during the exposure process. As an example, a linear motor (or motors) may be arranged to perform a displacement as indicated in the FIGS. 24a to 24c. FIG. 24a schematically depicts an initial position (the initial position is designated by f) of the holder 166 including the optical elements. FIG. 24c schematically depicts the position (the position reference axis P is indicated in FIGS. 24a and 24b) of the holder 166 as a function of time. FIG. 24b schematically depicts the position of the holder 166 in the position '−f'.

The arrangement as shown in FIG. 23 may also be applied to position different optical elements (such as diaphragm's) in a pupil plane of the illumination system. In that case, the optical elements should remain stationary during the exposure process and may only be displaced in between two consecutive exposures.

As an alternative to applying different optical elements, a programmable mirror array may also be applied to provide a change in the intensity distribution for the exposure of the first and second pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   (a) an illumination system configured to condition a radiation beam;
   (b) a substrate table constructed to hold a substrate;
   (c) a stage apparatus comprising:
      (i) a first object table configured to hold a first patterning device;
      (ii) a second object table configured to hold a second patterning device, each of the first and second patterning devices including a pattern to pattern the radiation beam, and the first and second patterning devices being arranged such that the pattern of the first patterning device and the pattern of the second patterning device are adjacent to each other in a scanning direction; and
      (iii) a positioning device configured to position the first and second patterning devices and the substrate;
   (d) a projection system configured to project the patterned radiation beam onto a target portion of the substrate such that during a scanning operation the pattern of the first patterning device and the pattern of the second patterning device are projected on the substrate, and
   (e) a masking device, the masking device comprising
      (i) a first masking part configured to obscure a first part of the first patterning device before the pattern of the first patterning device is impinged by the radiation beam;
      (ii) a second masking part that is deformable so as to adjust a length thereof, the second masking part configured to obscure a second part of the first patterning device after the pattern of the first patterning device is impinged by the radiation beam and to obscure a first part of the second patterning device before the pattern of the second patterning device is impinged by the radiation beam, and
      (iii) a third masking part configured to obscure a second part of the second patterning device after the pattern of the second patterning device is impinged by the radiation beam.

2. The lithographic apparatus of claim 1, wherein the second masking part includes a plurality of segments that are displaceable relative to each other so as to adjust the length of the second masking part.

3. The lithographic apparatus of claim 1, wherein the second masking part includes a flexible part so as to allow the length of the second masking part to be adjusted.

4. The lithographic apparatus of claim 1, further comprising a device configured to hold and adjust the length of the second masking part.

5. The lithographic apparatus of claim 1, further comprising a control device configured to position the positioning device, wherein the control device is constructed and arranged to provide the positioning device with a set-point adapted to:
- (1) accelerate the first patterning device to a first predetermined speed relative to the projection system of the lithographic apparatus,
- (2) accelerate the substrate to a predetermined scanning speed relative to the projection system so as to project the pattern of the first patterning device onto a first field of the substrate while substantially maintaining said scanning speed;
- (3) displace the substrate substantially at the predetermined scanning speed so as to skip an exposure of a non-zero number of exposure field pitch on the substrate arranged adjacent to the first field in the scanning direction; and
- (4) accelerate the second patterning device to the first predetermined speed relative to the projection system so as to expose the second pattern onto a second field of the substrate arranged adjacent to the non-zero number of exposure field pitch on the substrate in the scanning direction.

6. The lithographic apparatus of claim 5, wherein the non-zero number of exposure field pitch is selected such that an illumination setting of the lithographic apparatus is changed between successive exposures of the first field and the second field.

7. The lithographic apparatus of claim 1, wherein the illumination system comprises:
- an optical path comprising a first branch and a second branch, said first branch coupled in parallel to the second branch, the first branch comprising a first illumination unit configured to condition the radiation beam, and the second branch comprising a second illumination unit configured to condition the radiation beam, and
- a device configured to direct the radiation beam to the first branch or the second branch, such that the radiation beam is configured by the first illumination unit during exposure of the first exposure field with the pattern of the first patterning device and that the radiation beam is configured by the second illumination unit during exposure of the second exposure field with the pattern of the second patterning device.

8. The lithographic apparatus of claim 1, wherein a distance between the pattern of the first patterning device and the pattern of the second patterning device substantially equals a reduction factor of the projection system multiplied by a non-zero number of exposure field pitch.

9. The lithographic apparatus of claim 1, wherein a masking area defined by the second masking part has an adjustable length.

10. The lithographic apparatus of claim 1, wherein the first, second and third masking parts are movable along a same direction.

11. A device manufacturing method comprising:
- conditioning a beam of radiation;
- patterning the beam of radiation with a first and a second patterning device to form patterned beams of radiation;
- obscuring portions of the first and the second patterning device during the patterning with a plurality of mask parts, and
- projecting the patterned beams of radiation onto a substrate with a projection system,
- wherein the obscuring includes adjusting a length of one of the mask parts, the one of the mask parts configured to obscure a part of the first patterning device after a pattern of the first patterning device is impinged by the beam of radiation and to obscure a part of the second patterning device before a pattern of the second patterning device is impinged by the beam of radiation,
- wherein the adjusting includes deforming the one of the masking parts so as to adjust the length.

12. The method of claim 11 further comprising:
- arranging on a stage apparatus the first and the second patterning device such that the pattern of the first patterning device and the pattern of the second patterning device are adjacent to each other in a scanning direction;
- accelerating the first patterning device to a first predetermined speed relative to the projection system;
- accelerating the substrate to a predetermined scanning speed relative to the projection system;
- projecting the pattern of the first patterning device onto a first field of the substrate while substantially maintaining said scanning speed;
- displacing the substrate substantially at the predetermined scanning speed so as to skip an exposure of a non-zero number of exposure field pitch on the substrate arranged adjacent to the first field in the scanning direction;
- accelerating the second patterning device to the first predetermined speed relative to the projection system so as to expose the second pattern onto a second field of the substrate arranged adjacent to the non-zero number of exposure field pitch on the substrate in the scanning direction, and
- projecting the pattern of the second patterning device onto the second field of the substrate.

13. The method of claim 12, wherein the arranging includes arranging the first and a second patterning device such that the pattern of the first patterning device and the pattern of the second patterning device are adjacent to each other in a scanning direction with a distance between the pattern of the first patterning device and the pattern of the second patterning device substantially equals to a predetermined function of a reduction factor of the projection system and a non-zero number of exposure field pitch of a field pattern of the substrate;
- wherein accelerating the first and second patterning devices to the first predetermined speed relative to the projection system and accelerating the substrate to the predetermined scanning speed relative to the projection system include accelerating the first and second patterning devices and the substrate to a predetermined speed relative to the projection system;
- wherein the projecting includes projecting the pattern of the first patterning device onto the first field of the substrate while substantially maintaining said predetermined speed;
- wherein the displacing includes displacing the first and second patterning devices and the substrate substantially at the predetermined speed so as to skip a non-zero number of exposure field pitches on the substrate arranged adjacent to the first field in the scanning direction; and
- wherein the projecting includes projecting the pattern of the second patterning device onto the second field of the substrate arranged adjacent to the non-zero number of exposure field pitches on the substrate in the scanning direction.

14. The method of claim 13, wherein the non-zero number of exposure field pitches is selected such that an illumination setting of the lithographic apparatus is changed between successive exposures of the first field and the second field.

15. The method of claim 13, wherein the distance between the pattern of the first patterning device and the pattern of the second patterning device substantially equals the reduction factor of the projection system multiplied by the non-zero number of exposure field pitch.

16. The method of claim 12, wherein a masking area defined by said one of the mask parts has an adjustable length.

17. The method of claim 11, wherein the adjusting includes moving a plurality of segments included in the one of the masking parts relative to each other.

18. The method of claim 11, wherein the adjusting includes deforming a flexible part of the one of the masking parts.

19. The method of claim 11, wherein the one of the mask parts and two masking parts of the plurality of mask parts are movable along a same direction.

20. A masking device configured to obscure parts of a first patterning device and a second patterning device that are configured to pattern a radiation beam in a lithographic apparatus, the masking device comprising
 (i) a first masking part configured to obscure a first part of the first patterning device before a pattern of the first patterning device is impinged by the radiation beam;
 (ii) a second masking part that is deformable so as to adjust a length thereof, the second masking part configured to obscure a second part of the first patterning device after the pattern of the first patterning device is impinged by the radiation beam and to obscure a first part of the second patterning device before a pattern of the second patterning device is impinged by the radiation beam, and
 (iii) a third masking part configured to obscure a second part of the second patterning device after the pattern of the second patterning device is impinged by the radiation beam.

21. The masking device of claim 20, wherein the second masking part includes a plurality of segments that are displaceable relative to each other so as to adjust the length of the second masking part.

22. The masking device of claim 20, wherein the second masking part includes a flexible part so as to allow the length of the second masking part to be adjusted.

23. The masking device of claim 20, wherein a masking area defined by the second masking part has an adjustable length.

24. The masking device of claim 20, wherein the first, second and third masking parts are movable along a same direction.

* * * * *